US009456520B1

(12) United States Patent
Wilson et al.

(10) Patent No.: US 9,456,520 B1
(45) Date of Patent: Sep. 27, 2016

(54) SERVER RACK SYSTEM FOR MOUNTING EQUIPMENT

(71) Applicant: Innovation First, Inc., Greenville, TX (US)

(72) Inventors: James Whitney Wilson, Navada, TX (US); Hoainam James Tonthat, Greenville, TX (US); Robert H. Mimlitch, III, Rowlett, TX (US)

(73) Assignee: Innovation First, Inc., Greenville, TX (US)

( * ) Notice: Subject to any disclaimer, the term of this patent is extended or adjusted under 35 U.S.C. 154(b) by 21 days.

(21) Appl. No.: 14/865,931

(22) Filed: Sep. 25, 2015

(51) Int. Cl.
*H05K 7/00* (2006.01)
*A47F 5/00* (2006.01)
*H05K 7/14* (2006.01)
*A47B 47/00* (2006.01)
*A47B 47/02* (2006.01)
*H05K 7/18* (2006.01)

(52) U.S. Cl.
CPC ......... *H05K 7/1488* (2013.01); *A47B 47/0083* (2013.01); *A47B 47/027* (2013.01); *H05K 7/183* (2013.01)

(58) Field of Classification Search
CPC ......... A47F 5/00; B23P 11/00; A47G 29/00; A47B 88/04; H05K 7/18; H05K 7/20; G06F 1/20
See application file for complete search history.

(56) References Cited

U.S. PATENT DOCUMENTS

| | | | | |
|---|---|---|---|---|
| 5,149,026 A | * | 9/1992 | Allen | F16L 5/10 248/68.1 |
| 5,535,972 A | * | 7/1996 | Fallago | A47B 96/061 248/220.22 |
| 5,546,277 A | * | 8/1996 | Zandbergen | H05K 7/1429 211/26 |
| 5,791,498 A | * | 8/1998 | Mills | H02B 1/34 211/183 |
| 6,021,909 A | * | 2/2000 | Tang | H02B 1/36 211/183 |
| 6,190,081 B1 | * | 2/2001 | Besserer | H02B 1/32 211/183 |
| 6,220,461 B1 | * | 4/2001 | Dickinson | A47B 57/045 108/108 |
| 6,516,955 B1 | * | 2/2003 | Dudhwala | A47B 47/0008 211/182 |

(Continued)

*Primary Examiner* — Hoa C Nguyen
*Assistant Examiner* — Xanthia C Cunningham
(74) *Attorney, Agent, or Firm* — Adam K. Sacharoff; Much Shelist

(57) ABSTRACT

An improved server frame for securing equipment thereto. The server frame includes four corner secured between a base and a top. Each corner has a plurality of standard openings to receive ends of a standard rail system used to secure the equipment to the frame. The improvement defined by four interior posts, each has a base plate and an arm plate extending from the base plate. Each interior post is separately secured about the corner post. Each arm plate includes rail apertures. A pair of outer rails secured from the front to the rear of the server frame. Each outer rail has rear and front rear facing hooks configured to allow the outer rail to slide into engagement with the rail apertures on the interior posts, such that the outer rails are configured to receive inner rails secured to equipment for sliding the equipment into the server frame.

25 Claims, 28 Drawing Sheets

(56) References Cited

U.S. PATENT DOCUMENTS

| | | | | |
|---|---|---|---|---|
| 6,773,080 B2 * | 8/2004 | Chen | A47B 57/40 | 211/26 |
| 6,866,154 B2 * | 3/2005 | Hartman | A47B 88/044 | 211/191 |
| 6,891,727 B2 * | 5/2005 | Dittus | H05K 7/1489 | 211/26 |
| 7,281,633 B2 * | 10/2007 | Hartman | A47B 88/044 | 211/192 |
| 7,293,666 B2 * | 11/2007 | Mattlin | G06F 1/181 | 211/189 |
| 7,472,970 B2 * | 1/2009 | Bergesch | G06F 1/181 | 211/26 |
| 7,780,253 B1 * | 8/2010 | Lu | H05K 7/183 | 211/26 |
| 7,988,246 B2 * | 8/2011 | Yu et al. | A47B 88/044 | 211/175 |
| 8,787,023 B2 * | 7/2014 | Lewis, II | H05K 7/18 | 361/724 |
| 8,901,438 B2 * | 12/2014 | Lewis, II | H05K 7/18 | 174/50 |
| 2001/0040142 A1 * | 11/2001 | Haney | A47B 88/044 | 211/183 |
| 2002/0197045 A1 * | 12/2002 | Schmidt | G02B 6/4471 | 385/134 |
| 2003/0019824 A1 * | 1/2003 | Gray | A47B 57/30 | 211/26 |
| 2003/0106863 A1 * | 6/2003 | Lauchner | A47B 88/044 | 211/26 |
| 2004/0189161 A1 * | 9/2004 | Davis | H05K 7/1425 | 312/265.3 |
| 2005/0285492 A1 * | 12/2005 | Hu | A47B 88/044 | 312/334.4 |
| 2007/0221393 A1 * | 9/2007 | Adducci | E05D 7/1011 | 174/50 |
| 2008/0174217 A1 * | 7/2008 | Walker | H05K 7/186 | 312/329 |
| 2008/0266789 A1 * | 10/2008 | Hruby | H05K 7/20572 | 361/692 |
| 2009/0014614 A1 * | 1/2009 | Warmoth | H05K 7/1489 | 248/309.1 |
| 2009/0310894 A1 * | 12/2009 | Yu | A47B 88/04 | 384/21 |
| 2010/0084354 A1 * | 4/2010 | Eustace | A47B 57/50 | 211/134 |
| 2010/0200523 A1 * | 8/2010 | Henderson | A47B 88/044 | 211/26 |
| 2010/0243586 A1 * | 9/2010 | Henderson | H05K 7/1489 | 211/26.2 |
| 2011/0073726 A1 * | 3/2011 | Bergesch | H05K 7/183 | 248/201 |
| 2012/0062083 A1 * | 3/2012 | Lewis, II | H05K 7/18 | 312/223.1 |
| 2012/0062091 A1 * | 3/2012 | Donowho | H04Q 1/062 | 312/351.1 |
| 2012/0063099 A1 * | 3/2012 | Alaniz | H05K 7/183 | 361/724 |
| 2013/0342091 A1 * | 12/2013 | Walker | H05K 5/0247 | 312/265.5 |
| 2015/0152903 A1 * | 6/2015 | Lin et | F16B 12/10 | 248/213.2 |

* cited by examiner

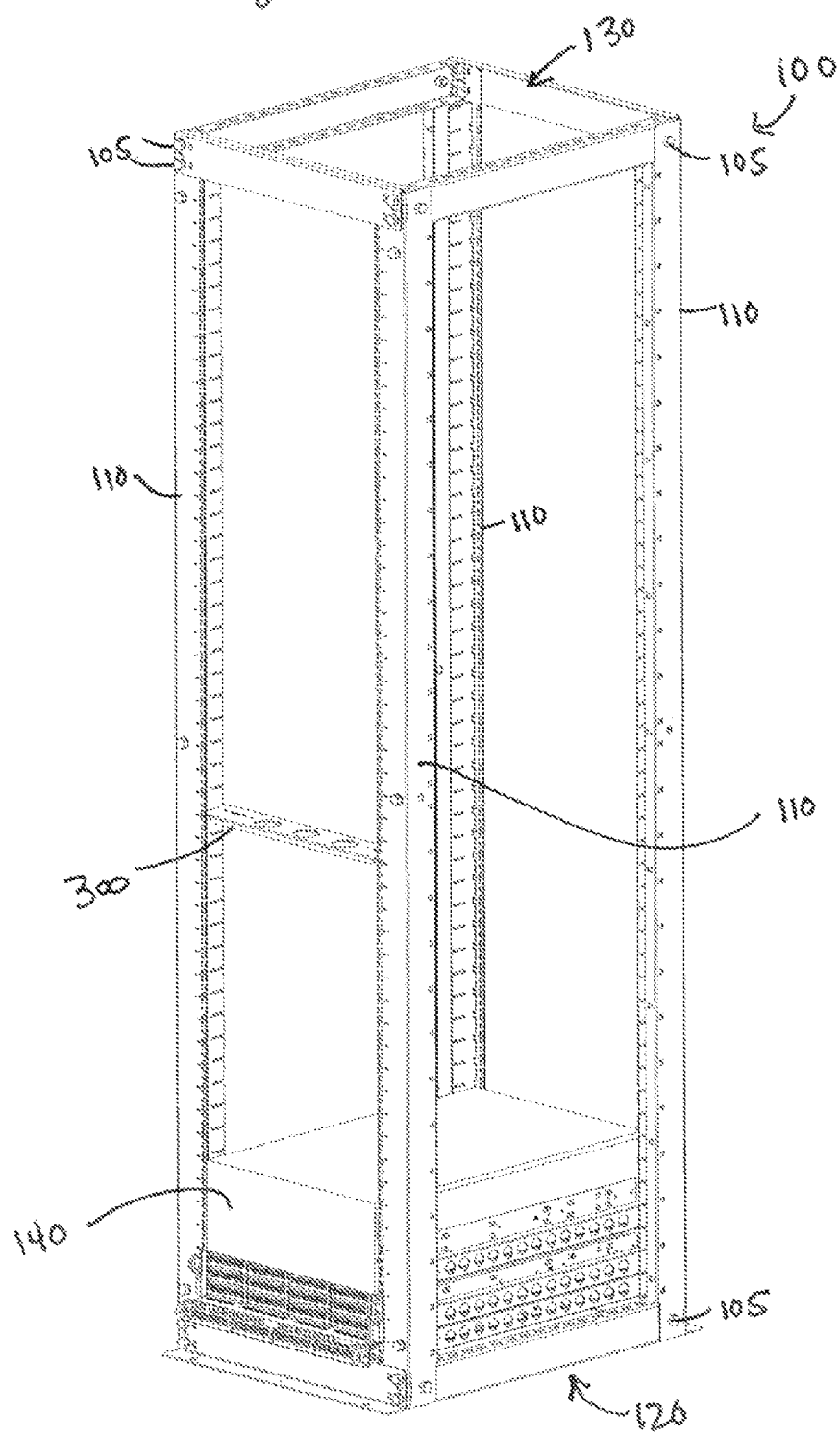

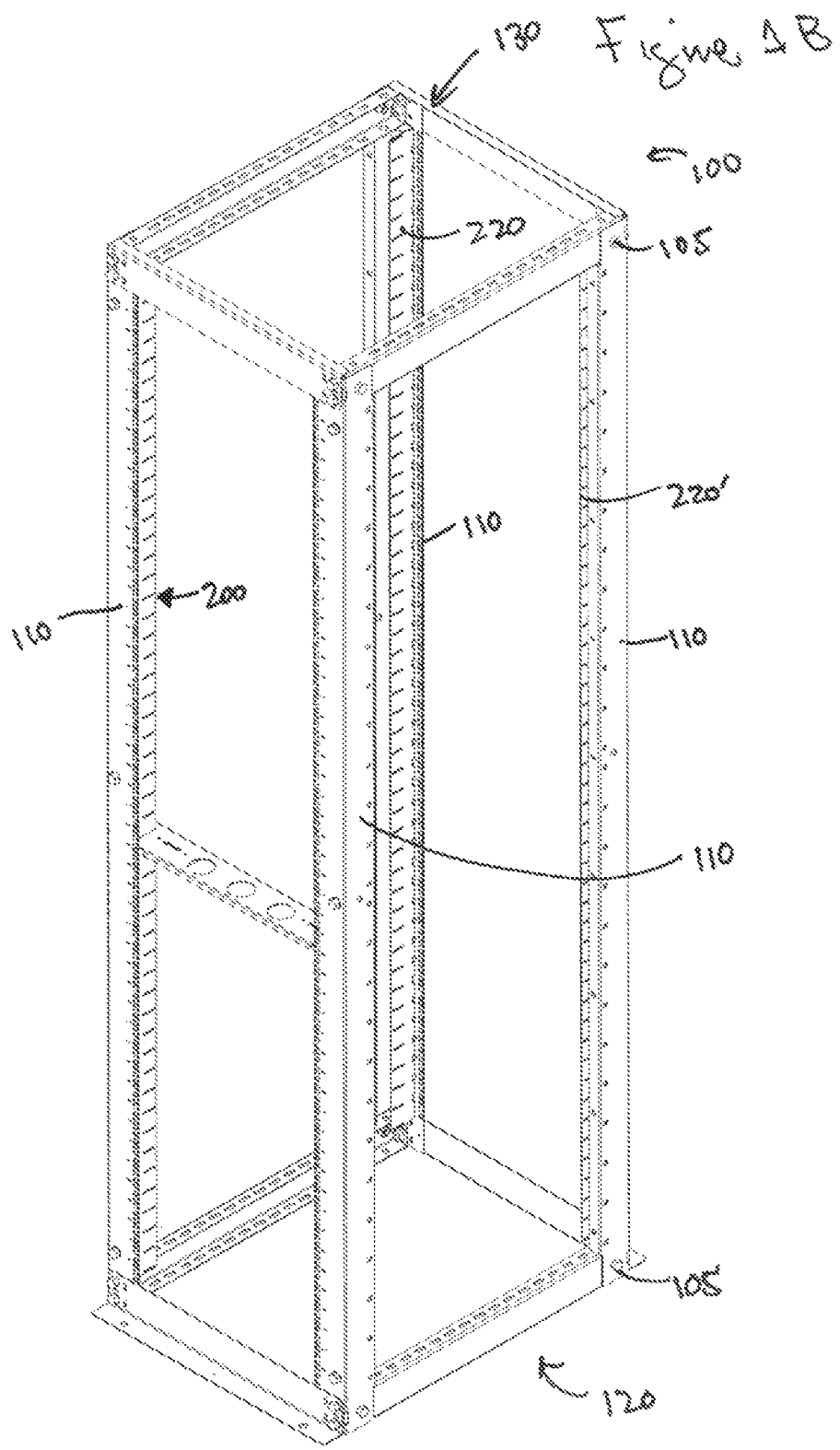

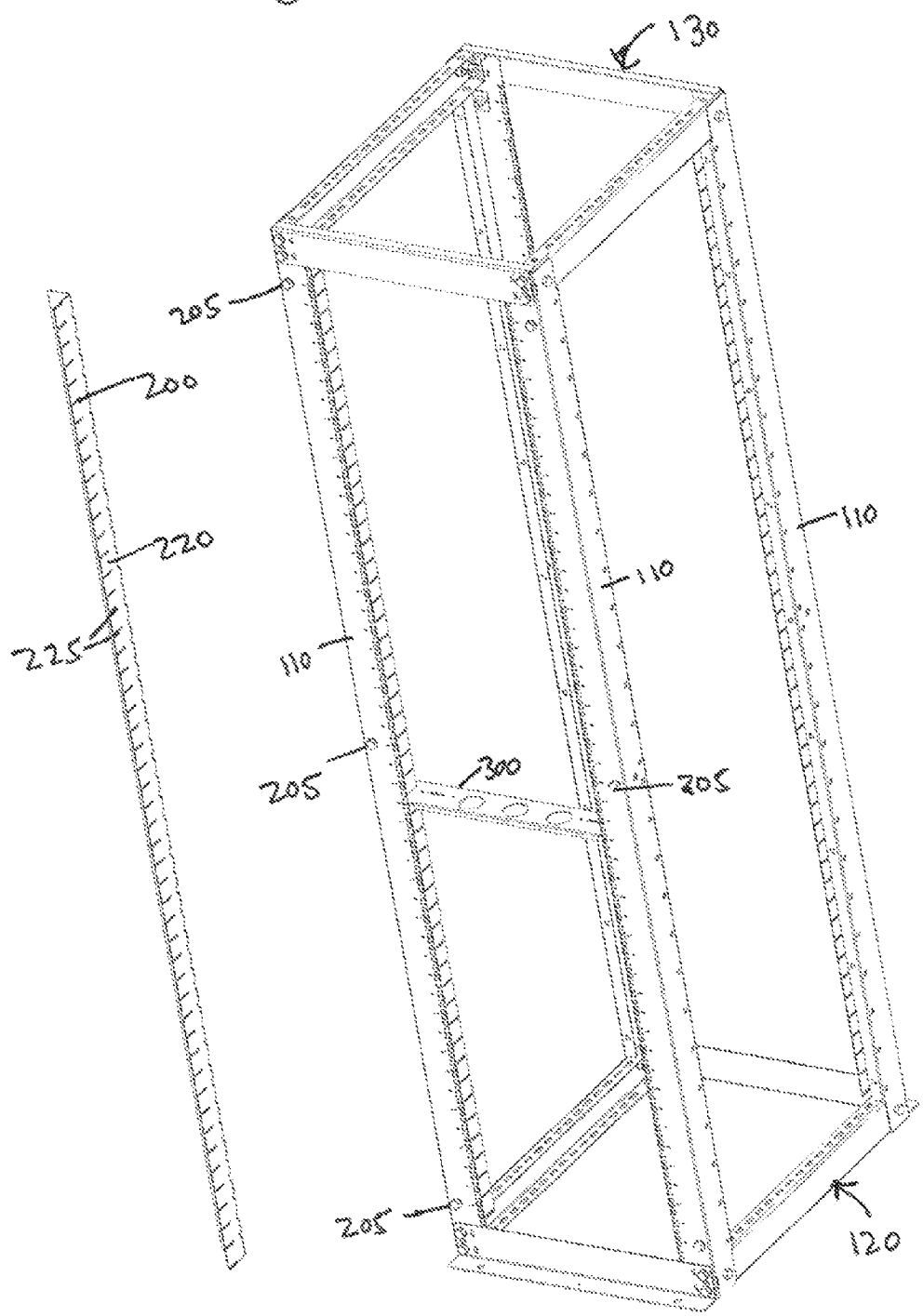

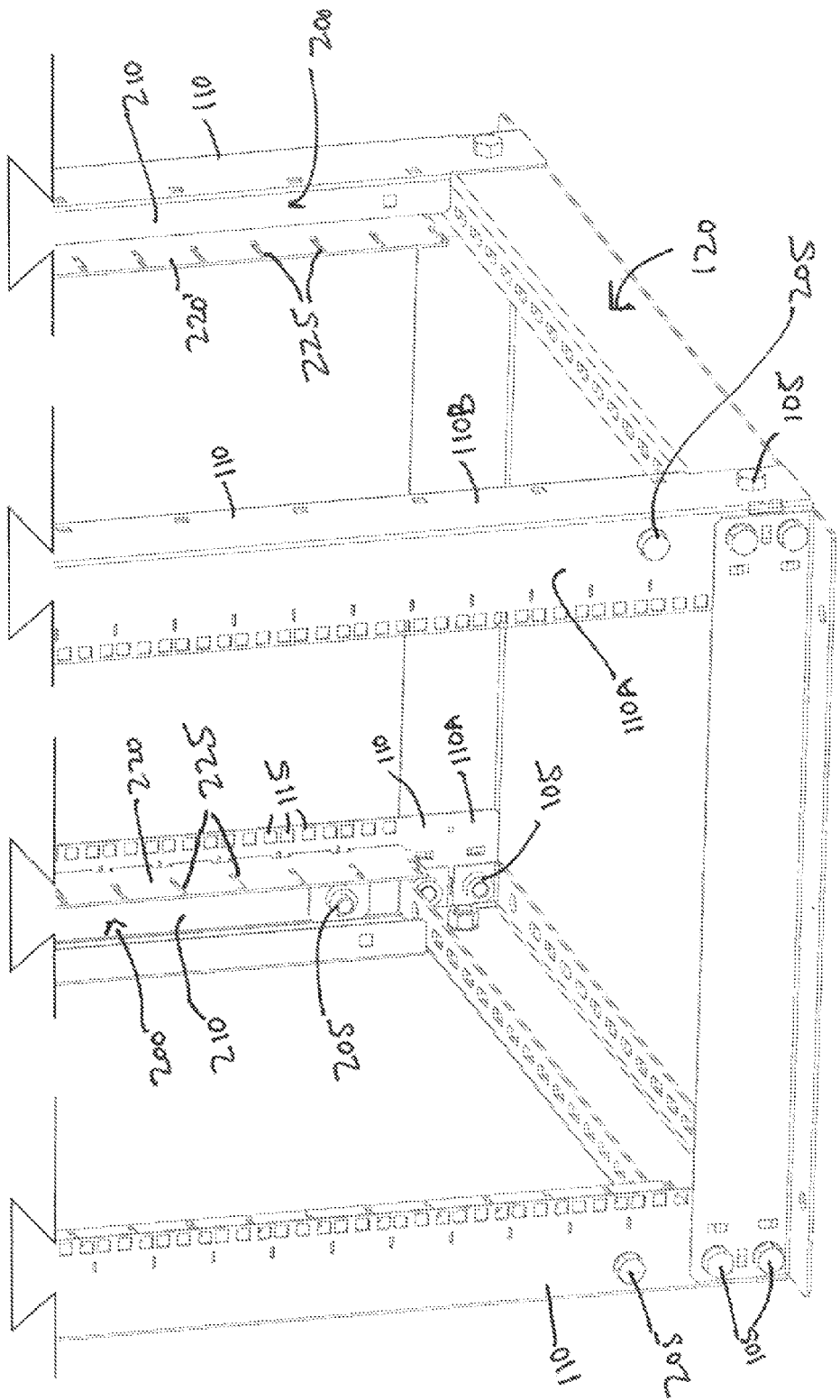

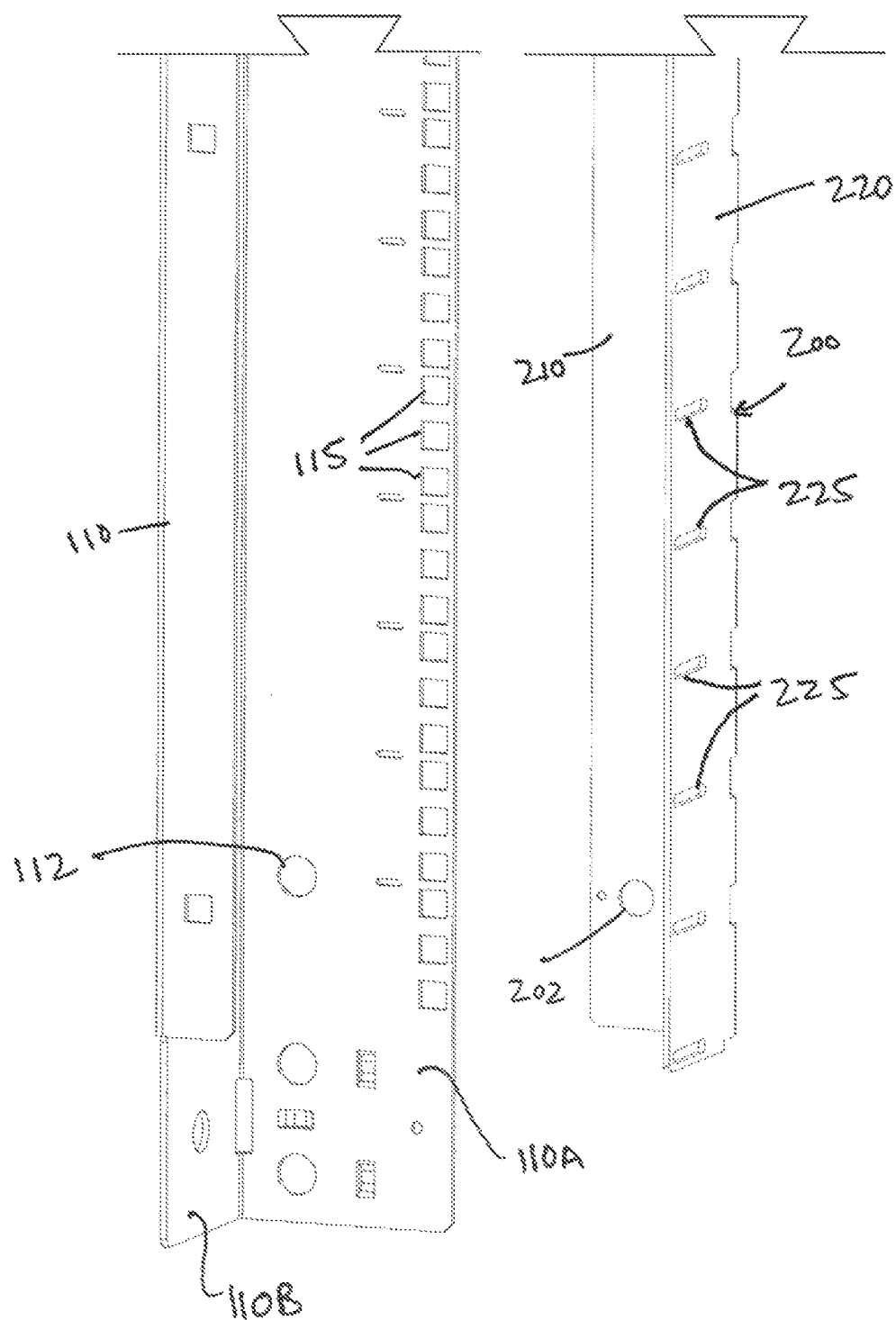

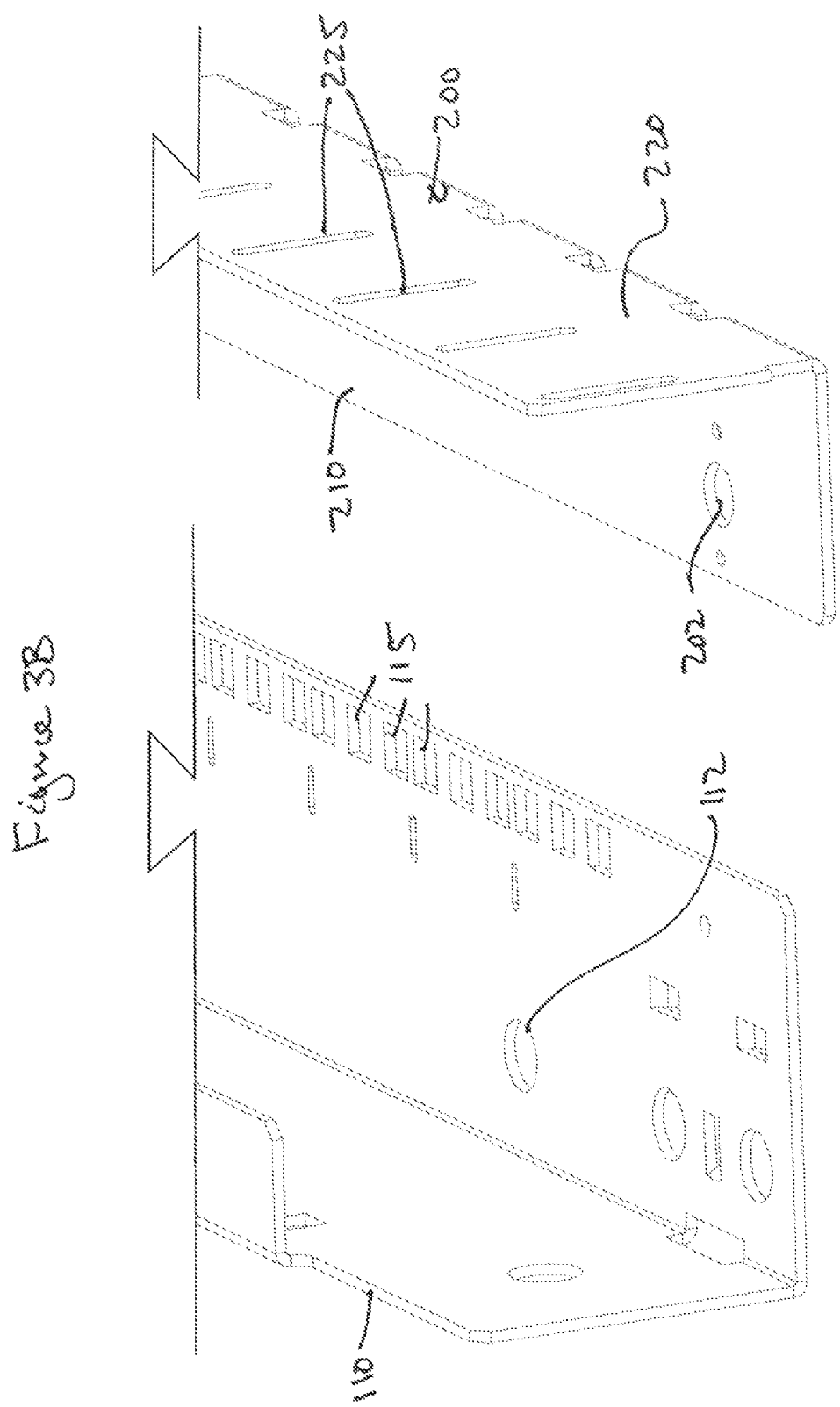

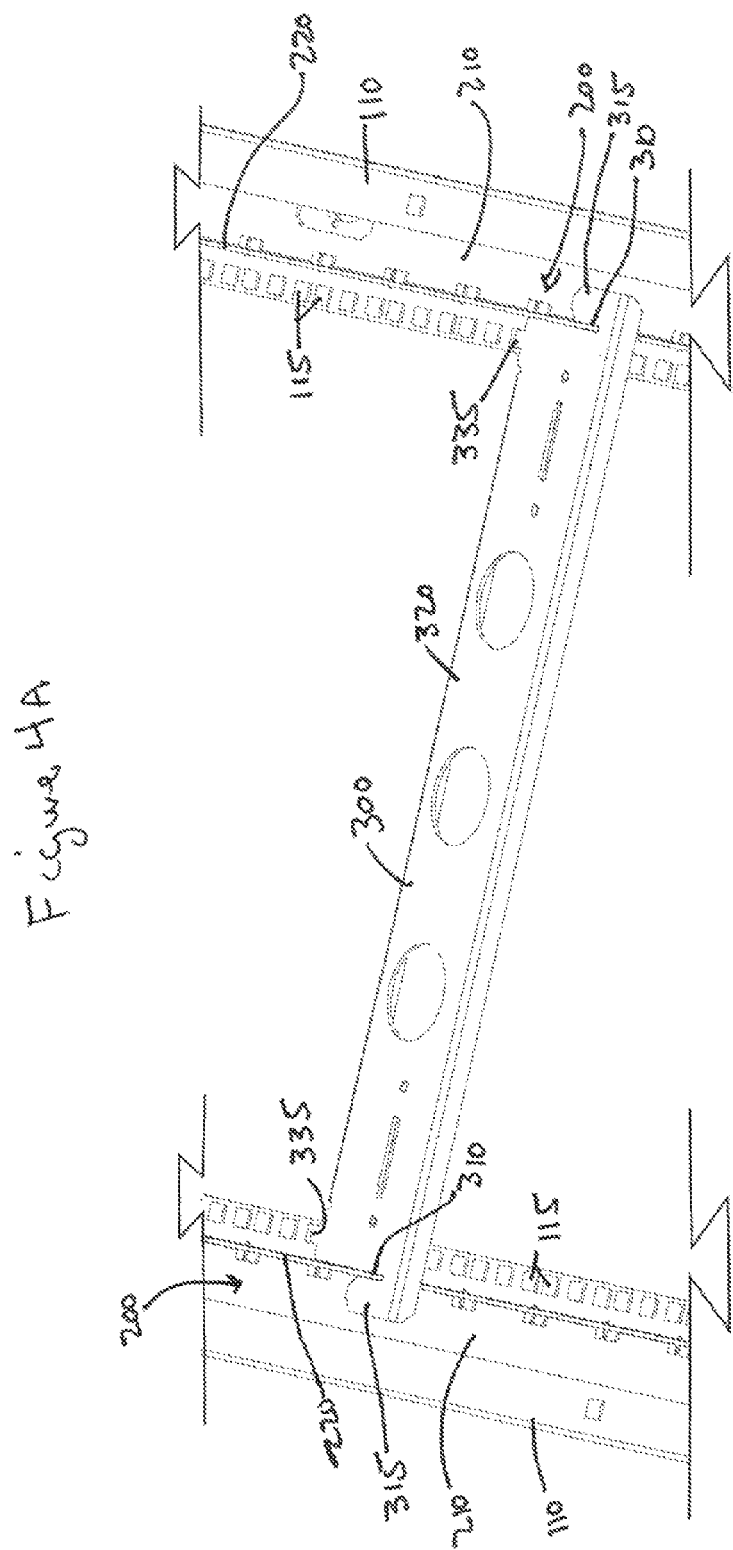

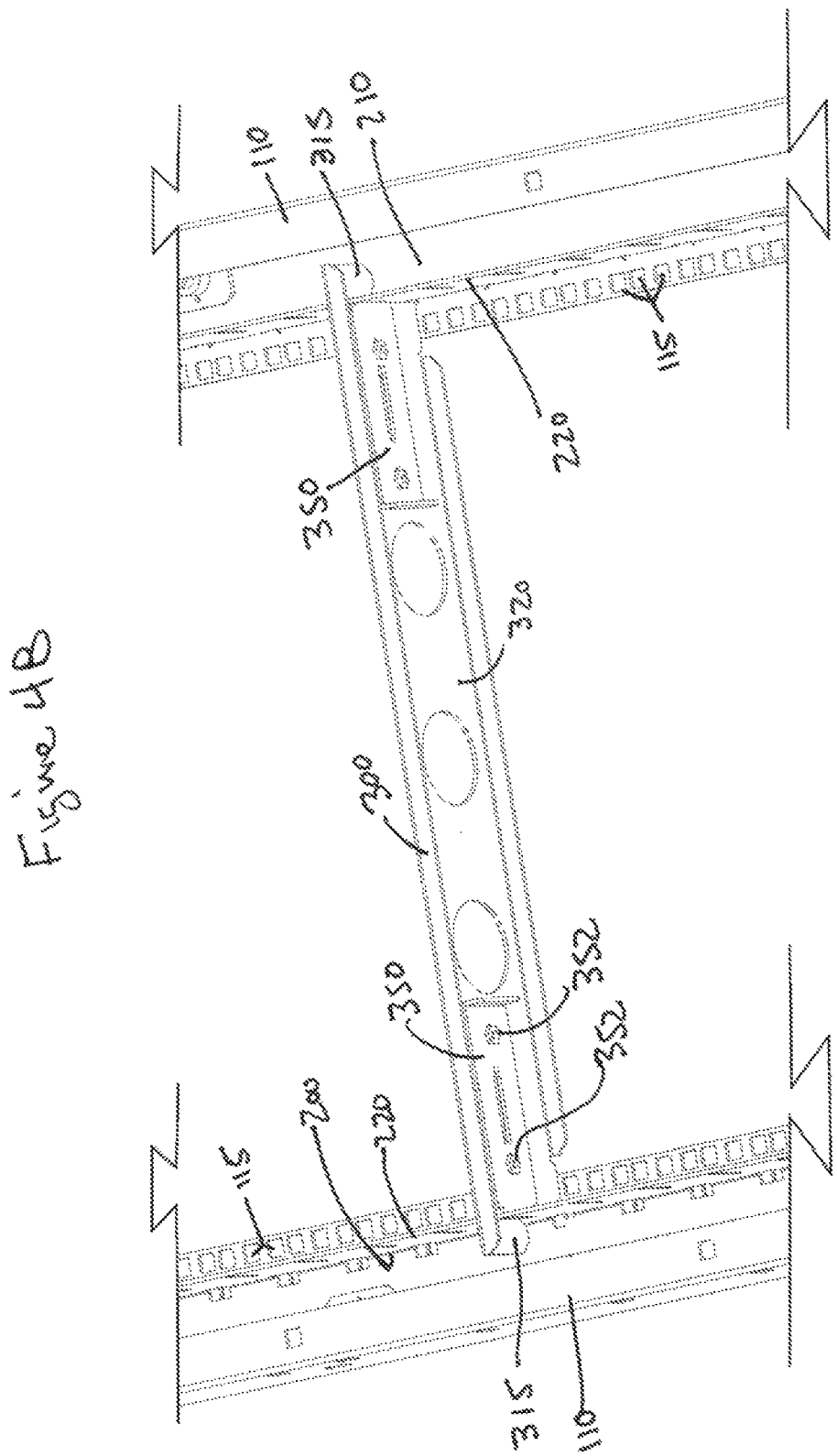

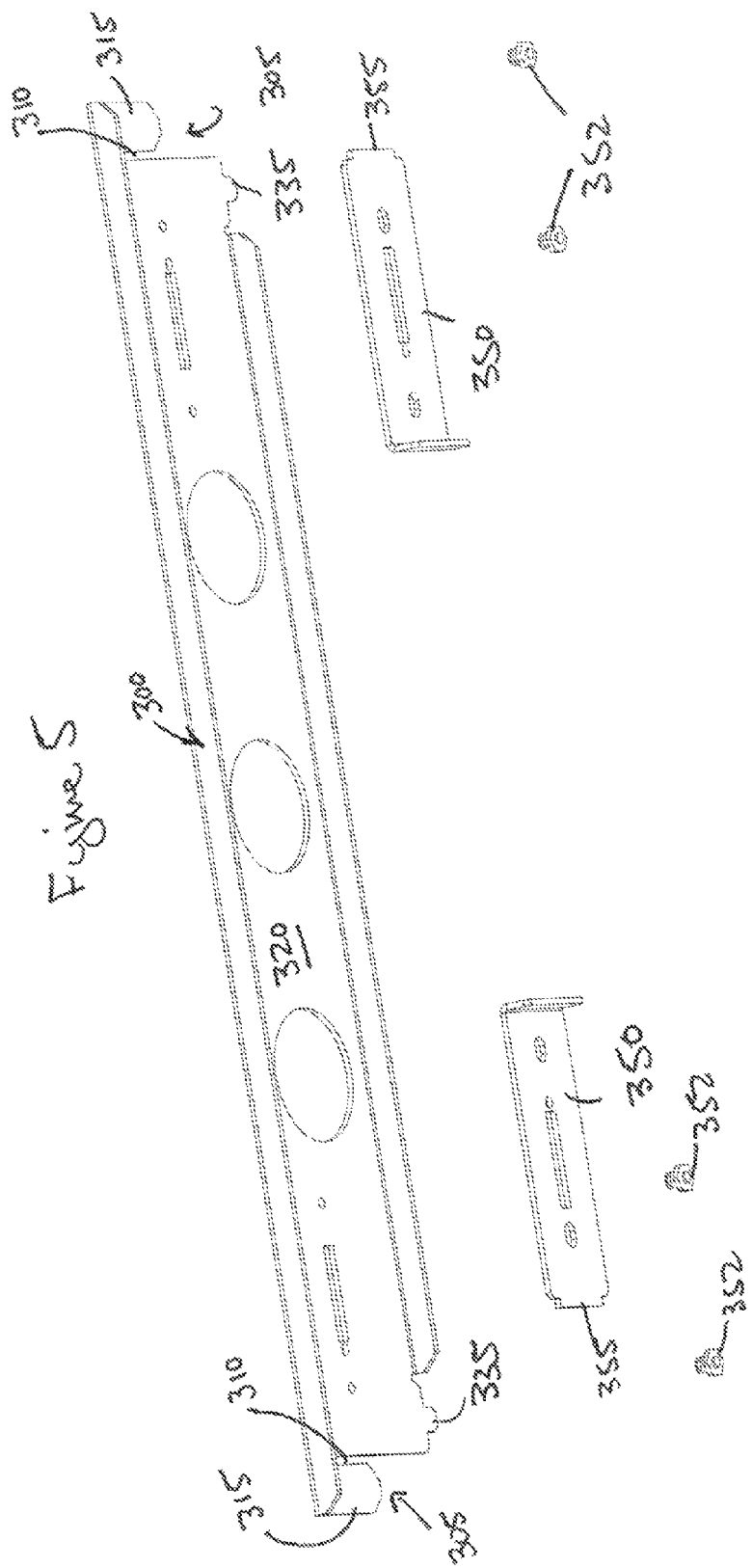

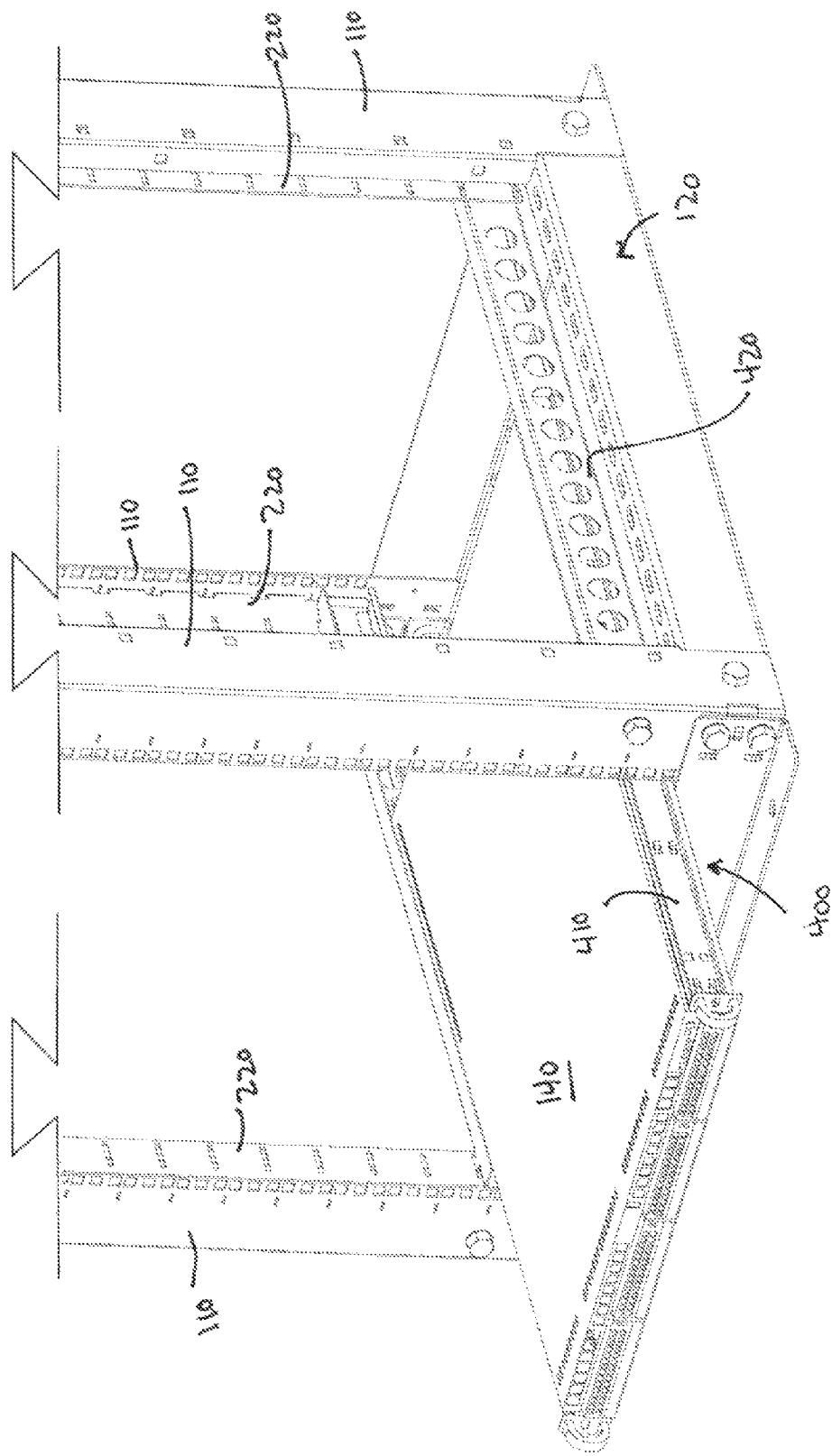

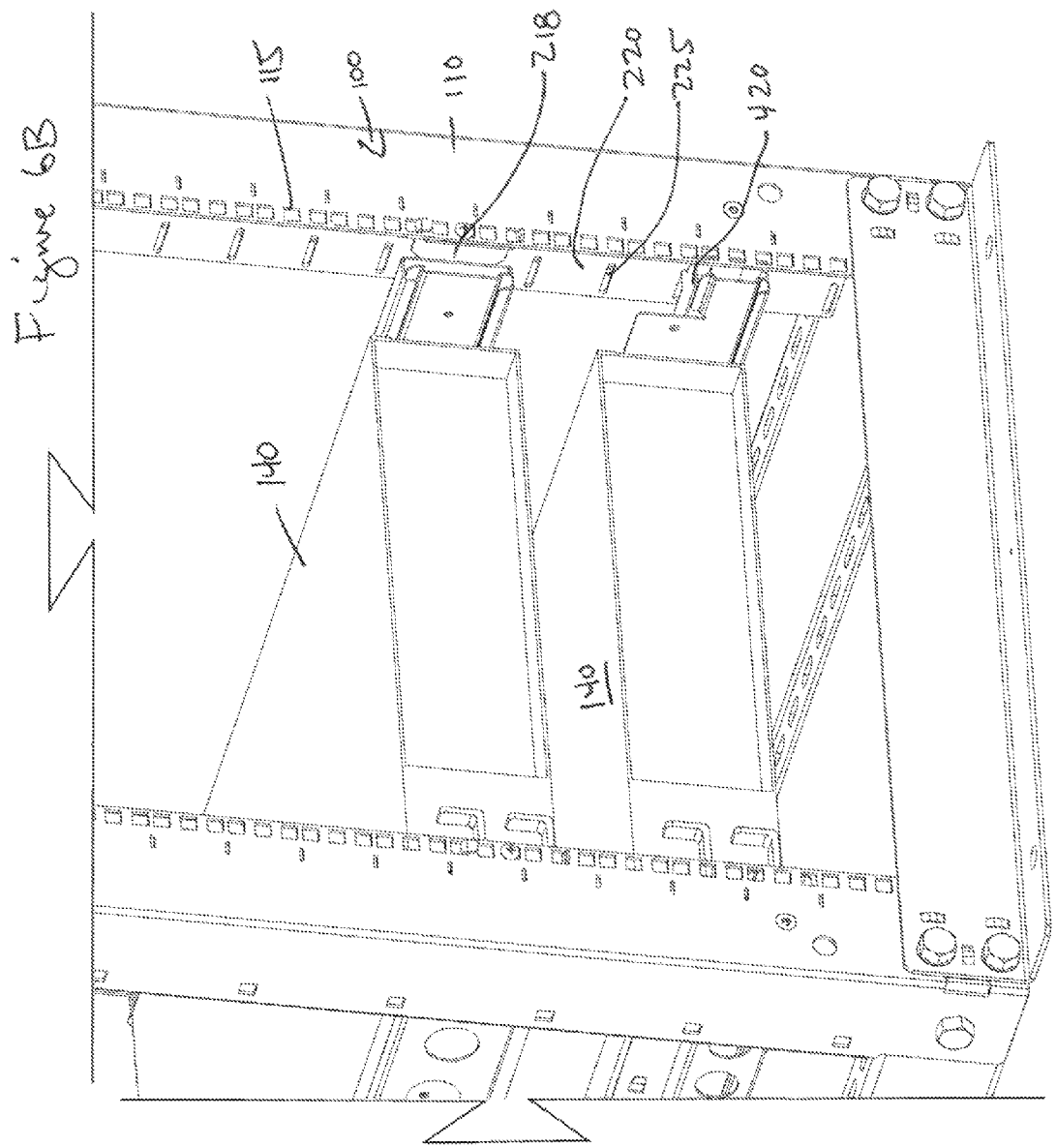

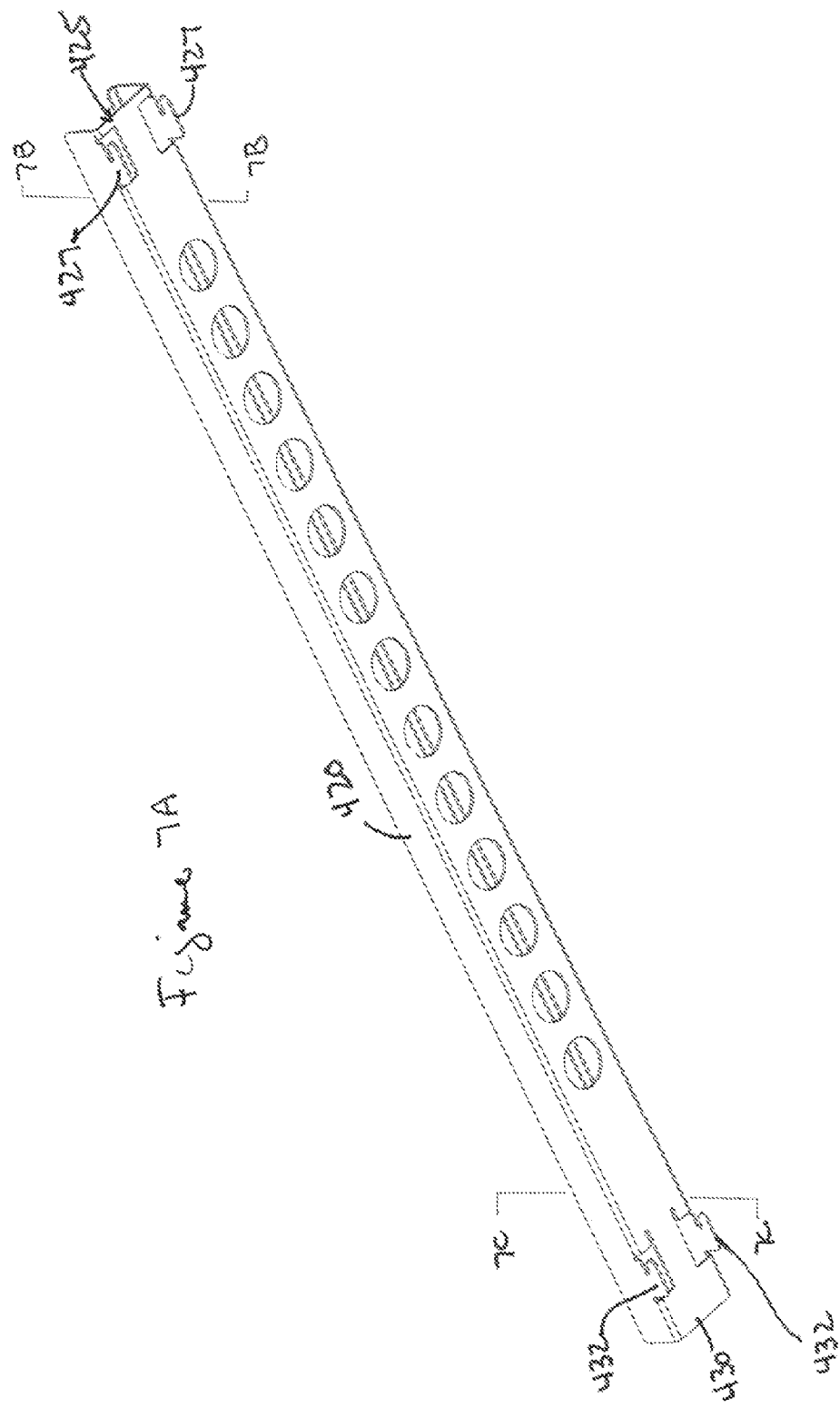

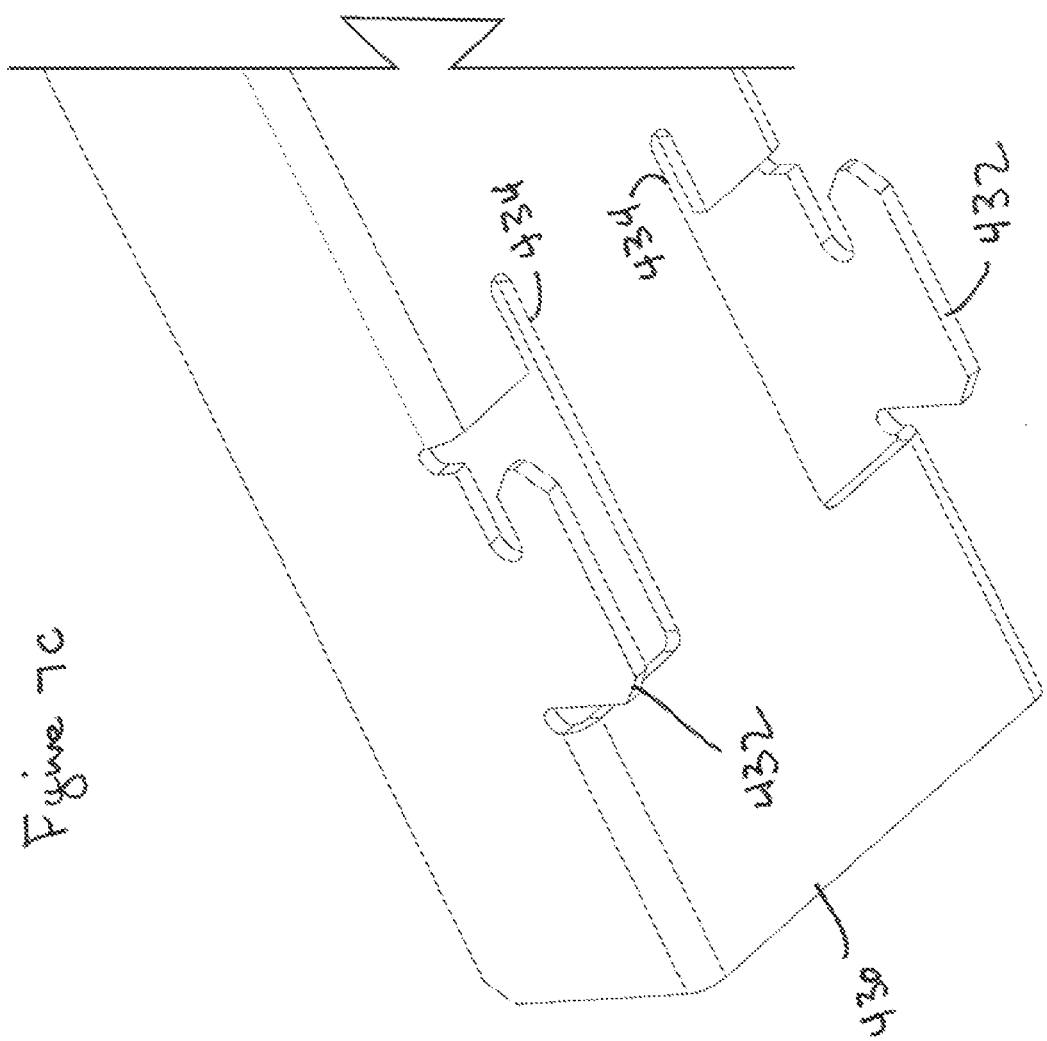

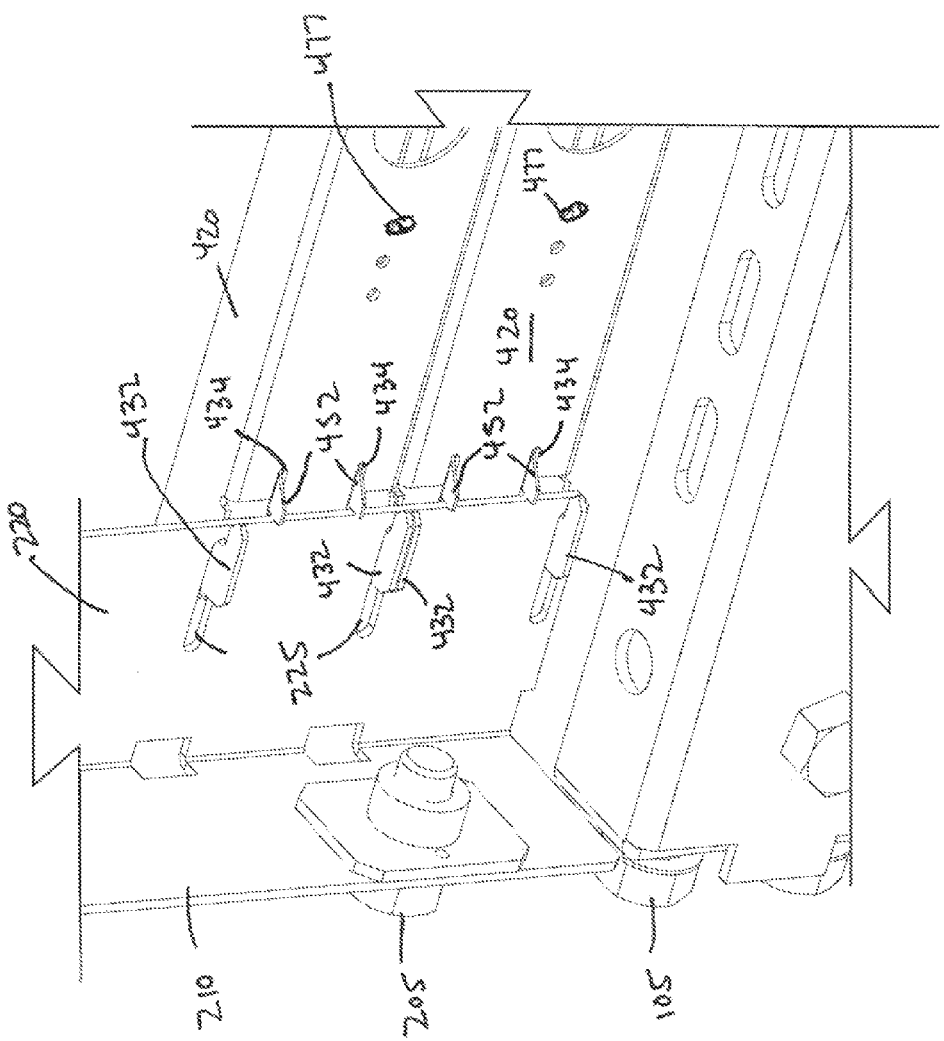

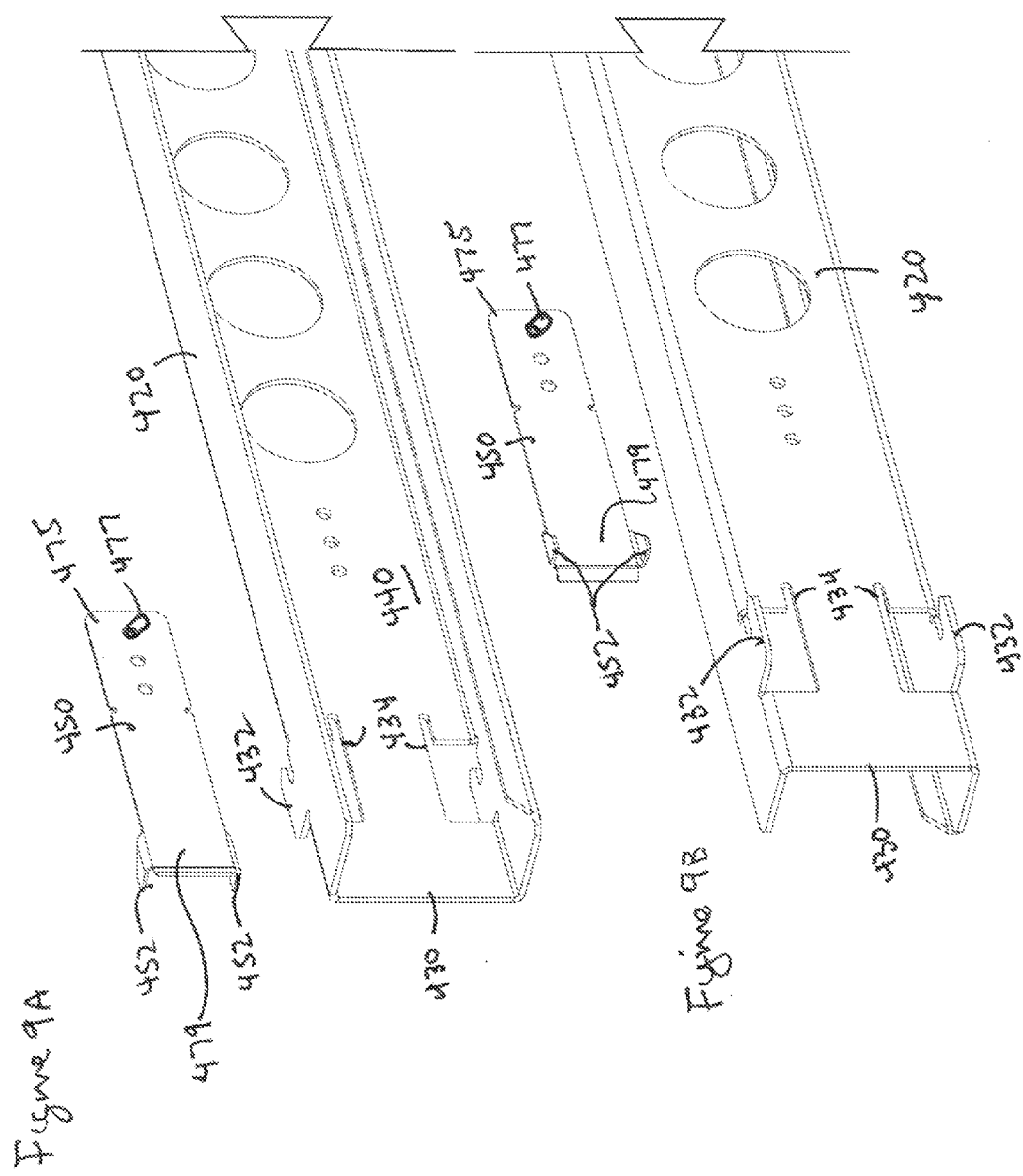

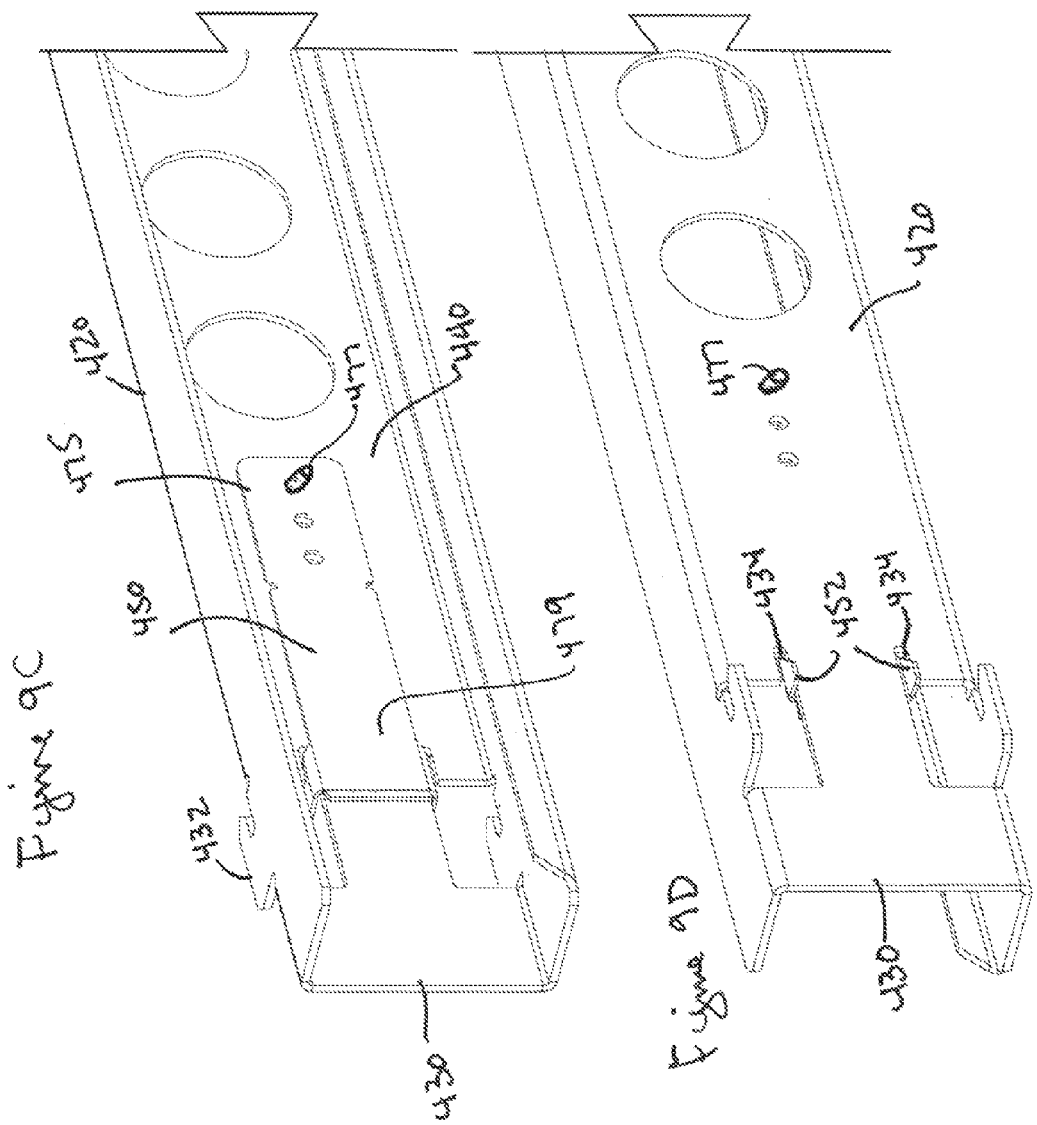

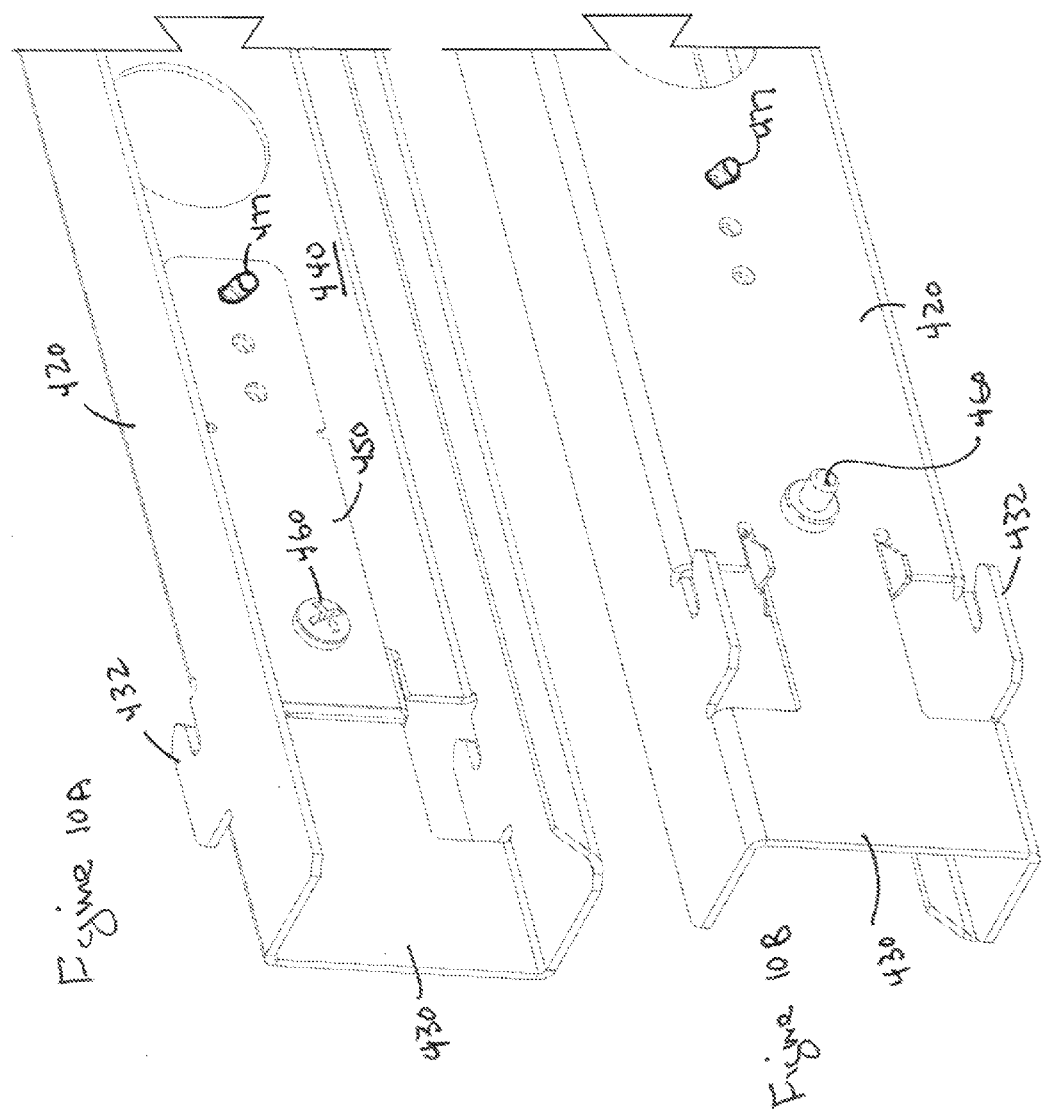

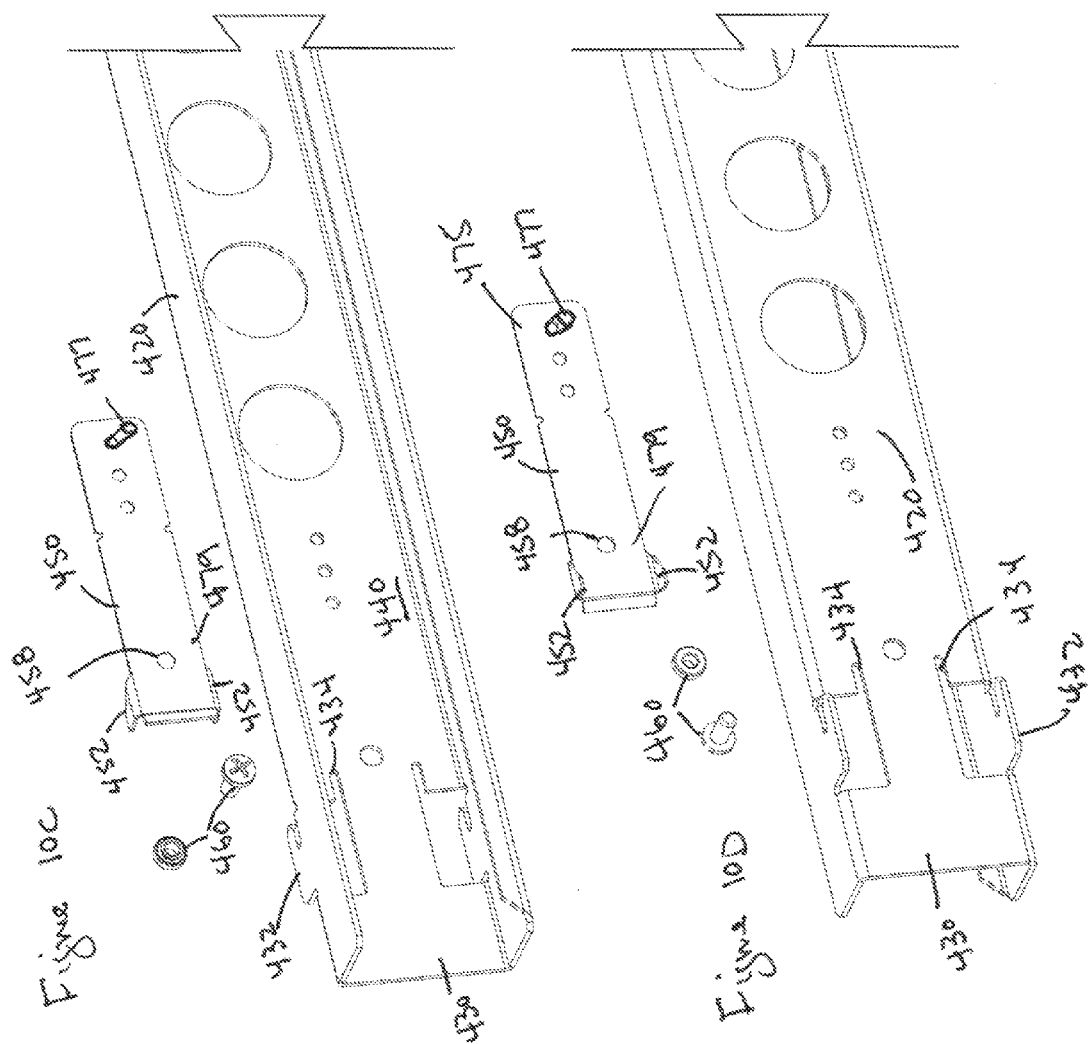

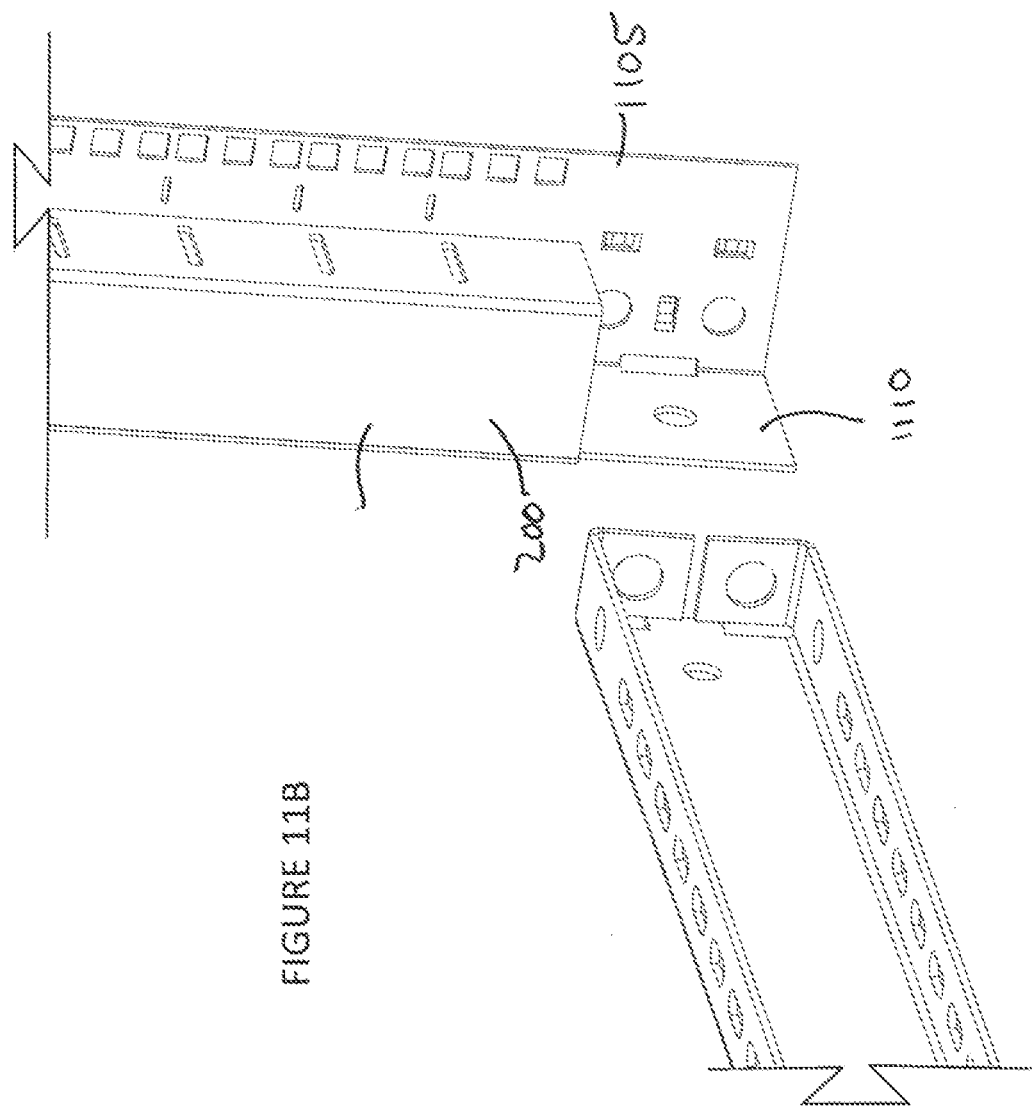

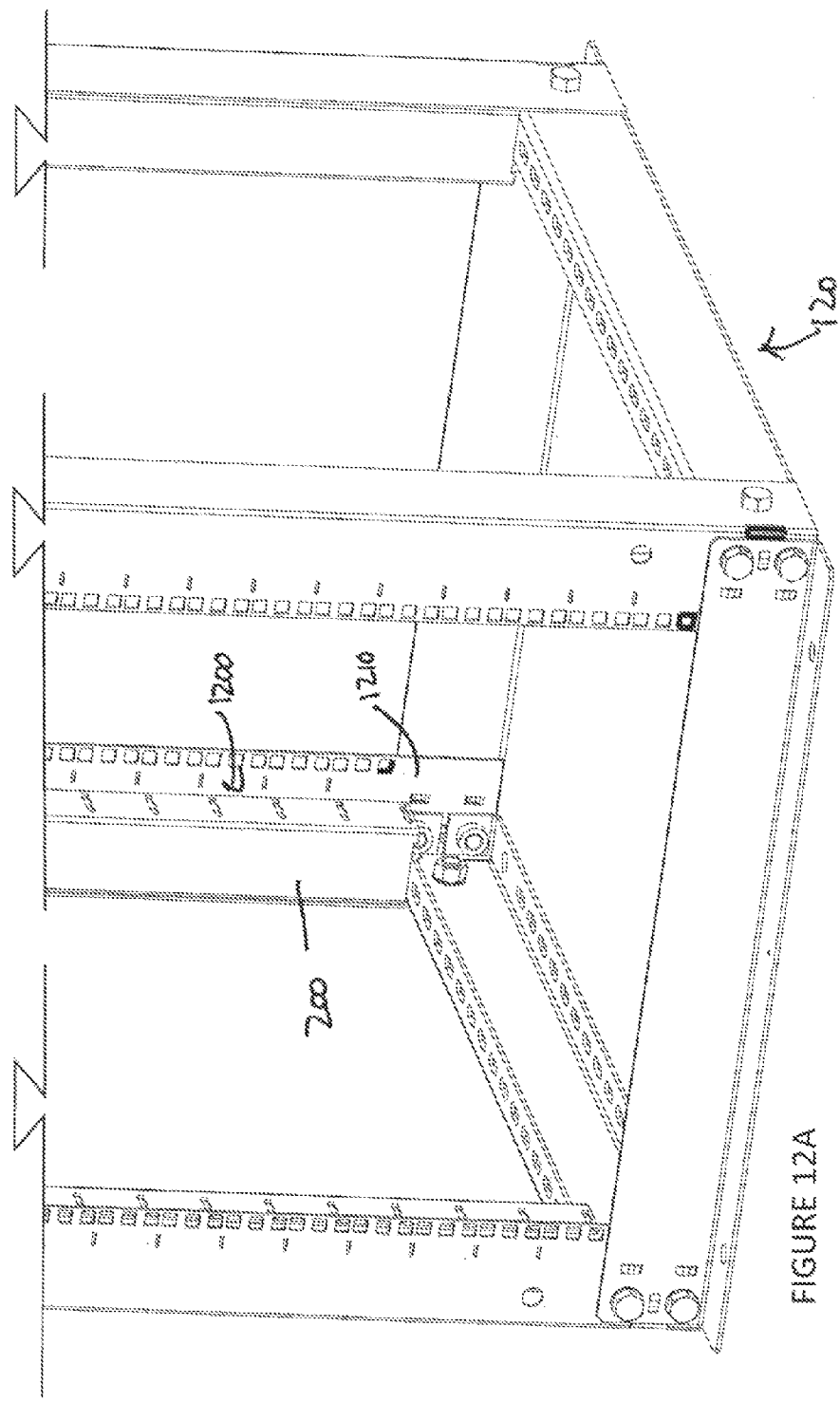

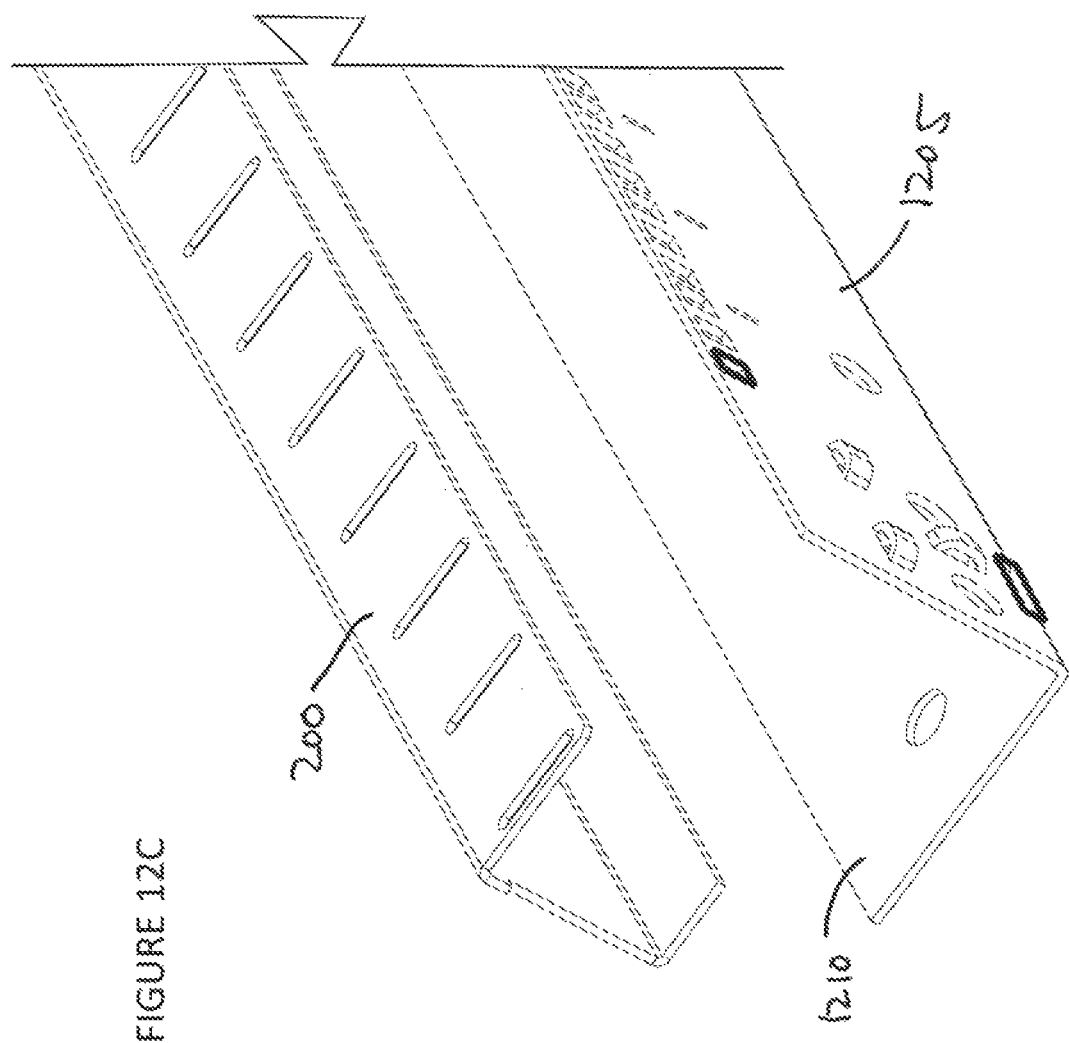

SERVER RACK SYSTEM FOR MOUNTING EQUIPMENT

TECHNICAL FIELD

The present invention relates to a server rack system having an interior post in a server frame for mounting equipment that is secured to sliding rails. More particularly, the invention relates to providing an interior post mounted in a standard server frame rack that does not interfere with standard rails connecting directly to the server frame and allows a new outside rail to be easily and more efficiently attached to the interior post.

BACKGROUND OF THE INVENTION

A variety of mechanical mounting structures have been devised for various structures including computer systems. In one example, such as a server system, a number of sub-components or servers are arranged in a central cabinet or on a rack structure, referred to herein as a standard server frame, well known in the industry. The servers are typically mounted in stacked vertical arrangements, with each server being secured within standard server frame by a sliding rail structure. The sliding rail structures permit the servers to be extracted and reinserted easily into the cabinet, such as for servicing of internal components of the servers. In general, it is desirable to allow each server to be fully or nearly fully withdrawn from the cabinet in order to gain a high degree of access to internal components of the individual server.

These standard server frames include four corner support rails which have standard EIA-310 specifications for hole spacing, and size dimensions, which allow a sliding rail support system to be secured in place. The support rail system includes an outer rail which is fixed to the corner support rails, while the inside sliding rail is secured to the individual servers. Because the servers are often quite heavy, and, when fully extended, constitute a significant cantilevered load, the support and sliding rail structures must offer a considerable resistance to loading, while affording easy sliding motion during displacement of the server. In most instances, the outer rails are fixed by screws in the back of the server frames. The screws present issues with access to the rear of the server frames. Oftentimes the rear is crowded with power and networking cables causing obstruction to the rear of the outer rail mounting brockets. It is therefore difficult and time consuming to install and or replace server or equipment in these standard frames. Separately from benefits over rails that require hardware, the present embodiments provide benefits over other tool-less rails. Pre-existing tool-less rails often employ complex slides, springs, and clips, while the present embodiments have only one moving part to assist with interlocking with the server frame. Therefore, the present embodiments reduce and eliminate complex end mechanisms found in pre-existing tool less rails. The pre-existing tool-less rails often reduce the amount of volume available to the server chassis by wrapping around the outside of the server frame ends. The present embodiments employ end mounting mechanism that are contained on the inside of the server frame to maximize the usable volume.

There is a need, therefore, for an improved technique for installing multiple computer components within a cabinet or rack. In particular, there is a need for the present invention. While the present invention is an additional cost to the standard server frame, it provides an easy means for installing and replacing equipment in a standard server frame.

SUMMARY OF THE INVENTION

In accordance with various aspects of the invention, there is provided an improved server frame for securing equipment thereto. The server frame includes four corner posts secured between a base structure and a top structure. Each corner post has a side wall and an end wall to define a pair of sides, a front and a rear of the server frame. Each corner post further has a plurality of standard EIA-310 openings to receive ends of a standard support rail system used to secure the equipment to the server frame.

The improvement includes attaching four interior posts separately adjacent or to the corner posts that do not interfere with the standard EIA-310 openings in the corner posts and which provide additional openings such that standard support rails and secondary supports rails can both be connected to the server rack. As provided in more detail, each interior post includes a base plate and an arm plate extending from the base plate and extending inwardly such that the arm plate is facing a diametrically opposed arm plate on an opposite corner of the server frame. Each interior post is separately secured to either (a) an end wall or a side wall of a corner post, or (b) the base and top structure of the server frame. Each arm plate includes rail apertures extending along a portion of the interior posts. In addition, the improvement includes a pair of outer rails, separately secured from the front to the rear or rear to front of each side of the server frame. Each outer rail has a rear end and a front end with rear facing hooks positioned on both the rear end and the front end of the outer rail. The rear facing hooks are configured to slide into and engage the rail apertures on the interior posts. In addition, when the pair of outer rails are secured to the interior posts, the outer rails are configured to receive inner rails secured to equipment for sliding the equipment into the server frame.

In another embodiment of the invention, each interior post may have the arm plate extending substantially perpendicularly from the base plate. Each interior post may also be secured to the corner posts or top and bottom structures of the server frame by at least two fasteners.

In yet another embodiment, the improved server frame may include a support brace secured between a pair of interior posts. The support brace may include brace ends with an end slot to receive the arm plate when attached. Each end slot may have an extension pin that is sized to extend into an EIA-310 opening on the corner post. Furthermore, the support brace may include an end bracket secured to each brace end. Each end bracket may also include a bracket head sized to fit in a rail aperture on the interior post.

In another embodiment of the invention, each outer rail may further include a clip secured at each end and against an inside portion of the outer rail. The clip may be secured adjacent the rear facing hooks on the front end of the outer rail. The clip may further have a pair of outwardly facing flanges configured to fit in grooves positioned adjacent the front end. The clip may also be made from a material configured to flex such that the outwardly facing flanges move to allow the front end of the outer rail to engage against the interior post. The clip may also be secured to the inside position of the outer rail by a fastener to prevent the outwardly facing flanges to flex and thereby preventing the front end of the outer rail to disengage from the interior post.

In another embodiment, there is provided an improved server frame for securing equipment thereto. The server frame, as previously described, includes four corner posts secured between a base and a top. Each corner post has a side wall and an end wall thereby defining a pair of sides, a front and a rear of the server frame. Each corner post further has a plurality of standard EIA-310 openings to receive ends of a standard support rail system used to secure the equipment to the server frame. The improvement is defined by four interior posts, that are configured as a pair of front interior posts and a pair of rear interior posts. Each interior post has a base plate and an arm plate extending from the base plate substantially perpendicularly and inwardly such that the pair of front interior posts face each other and the pair of rear interior posts face each other. Each interior post is separately secured to one of the corner posts or the top and base of the server frame. Each arm plate includes rail apertures extending along at least a portion of the arm plate. In addition, a pair of outer rails, separately secured from the front to the rear of each side of the server frame, is provided. Each outer rail has a rear end and a front end with rear facing hooks positioned at both ends of the outer rail. The rear facing hooks are configured to slide into engagement with the rail apertures on the interior posts. In addition, when the pair of outer rails are secured to the interior posts, the outer rails are configured to receive inner rails secured to equipment for sliding the equipment into the server frame.

In another embodiment of the present invention there is provided four interior posts configured for attachment to a server frame. The interior posts are configured as a pair of front interior posts and a pair of rear interior posts, each interior post has a base plate and has an arm plate extending from the base plate substantially perpendicularly and inwardly such that the pair of front interior posts face each other and the pair of rear interior posts face each other. Each interior post may be separately secured to one of the corner posts or the top and bottom portion of the server frame. Each arm plate includes rail apertures extending along at least a portion of the arm plate. A pair of outer rails, separately secured from the front to the rear of each side of the server frame, is provided. Each outer rail has a rear end and a front end with rear facing hooks positioned on both ends. The rear facing hooks are configured to slide into engagement with the rail apertures on the interior posts. A clip is further secured at an end against an inside portion of the outer rail and secured adjacent the rear facing hooks on the front end of the outer rail. The clip further has a pair of outwardly facing flanges configured to fit in grooves positioned adjacent the front end, and the clip is made from a material configured to flex such that the outwardly facing flanges move to allow the front end of the outer rail to engage against the interior post. In addition, when the pair of outer rails are secured to the interior posts, the outer rails are configured to receive inner rails secured to equipment for sliding the equipment into the server frame.

Numerous other advantages and features of the invention will become readily apparent from the following detailed description of the invention and the embodiments thereof, from the claims, and from the accompanying drawings.

DESCRIPTION OF DRAWINGS

A fuller understanding of the foregoing may be had by reference to the accompanying drawings, wherein:

FIG. 1A is a perspective view of the improved server frame in accordance with an embodiment of the present invention having interior posts positioned within the corner posts to receive an improved outer rail;

FIG. 1B is another perspective view of the improved server fame in accordance with an embodiment of the present invention;

FIG. 1C is another perspective view of the improved server frame in accordance with an embodiment of the present invention illustrating one of the interior post on the side of the server frame;

FIG. 2 is another perspective view of the improved server frame in accordance with an embodiment of the present invention illustrating a close up sectional view;

FIG. 3A is a perspective view of the improved server frame in accordance with an embodiment of the present invention illustrating a portion of the corner post and interior post;

FIG. 3B is another perspective view of the improved server frame in accordance with an embodiment of the present invention illustrating a portion of the corner post and interior post;

FIG. 4A is a perspective sectional view of the improved server frame in accordance with an embodiment of the present invention illustrating the brace;

FIG. 4B is a bottom perspective sectional view of the improved server frame in accordance with an embodiment of the present invention illustrating the brace;

FIG. 5 is a perspective exploded view of the brace;

FIG. 6A is a partial view of the improved server frame in accordance with an embodiment of the present invention illustrating a server sliding out of the frame;

FIG. 6B is a partial view of an improved server frame in accordance with an embodiment of the present invention showing two servers attached, one being attached to the corner posts and one being attached to the interior posts;

FIG. 8 is an enlarged section view illustrating the outer rail connecting to the interior post in accordance with an embodiment of the present invention;

FIG. 9A is an enlarged section view from an interior view of the front end of the outer rail showing the clip exploded away from the outer rail in accordance with an embodiment of the present invention;

FIG. 9B is an enlarged section view from an exterior view of the front end of the outer rail showing the clip exploded away from the outer rail in accordance with an embodiment of the present invention;

FIG. 9C is an enlarged section view from an interior view of the front end of the outer rail showing the clip connected to the outer rail in accordance with an embodiment of the present invention;

FIG. 9D is an enlarged section view from an exterior view of the front end of the outer rail showing the clip connected to the outer rail in accordance with an embodiment of the present invention;

FIG. 10A is an enlarged section view from an interior view of the front end of the outer rail showing the clip connected to the outer rail in accordance with an embodiment of the present invention;

FIG. 10B is an enlarged section view from an exterior view of the front end of the outer rail showing the clip connected to the outer rail in accordance with an embodiment of the present invention;

FIG. 10C is an enlarged section view from an interior view of the front end of the outer rail showing the clip exploded away from the outer rail in accordance with an embodiment of the present invention;

FIG. 10D is an enlarged section view from an exterior view of the front end of the outer rail showing the clip exploded away from the outer rail in accordance with an embodiment of the present invention; and FIGS. 11A through 11C illustrate in an alternative embodiment the interior post being part of the corner post, to create a new corner post.

FIGS. 12A through 12C illustrate in an alternative embodiment the interior post being secured to the side wall of the corner post, via fasteners or by welding.

DETAILED DESCRIPTION OF THE EMBODIMENTS

Figure 6C:
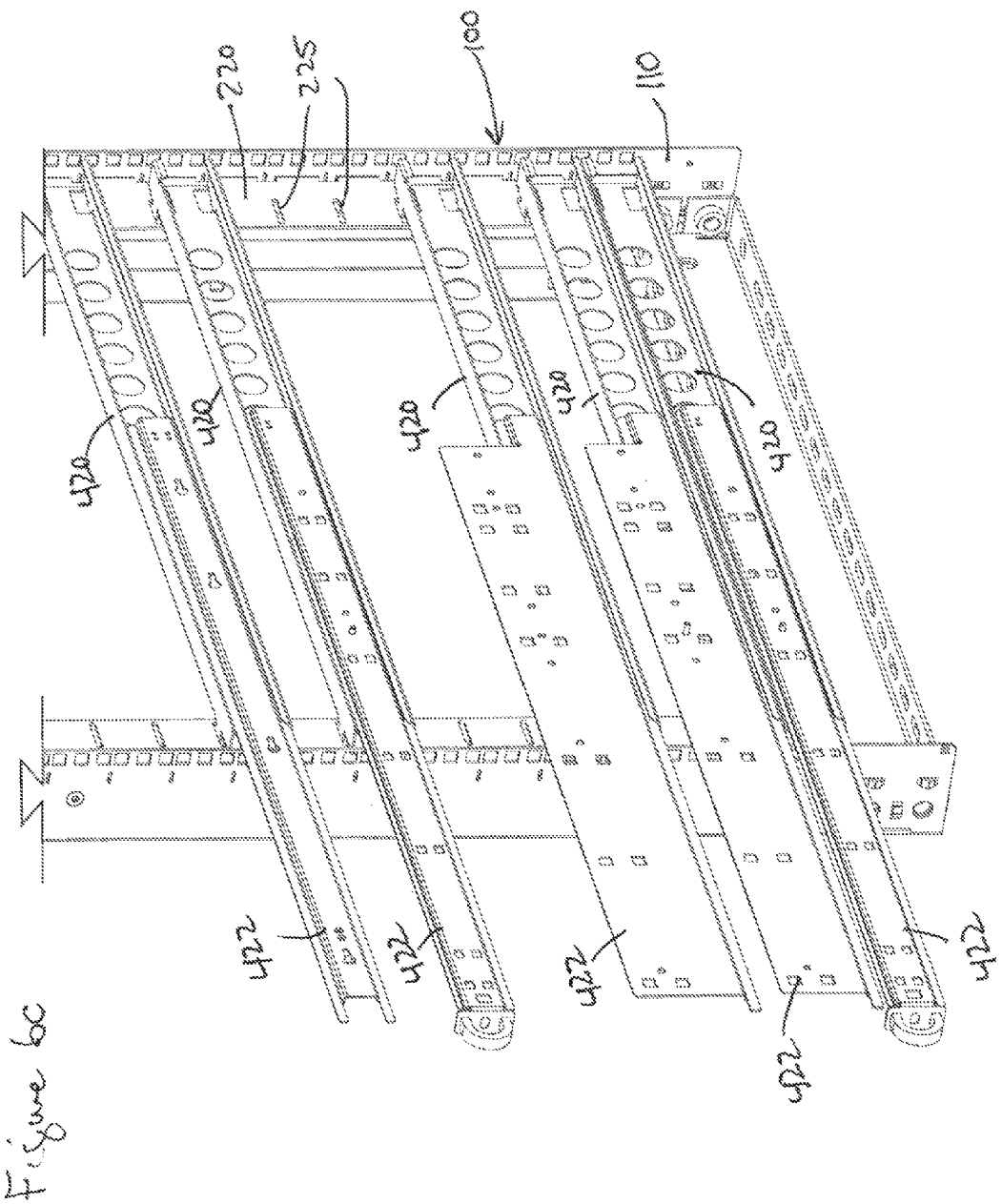
FIG. 6C is a partial view of an improved server frame in accordance with an embodiment of the present invention showing numerous rails attached to the interior posts.
Figure 7R:
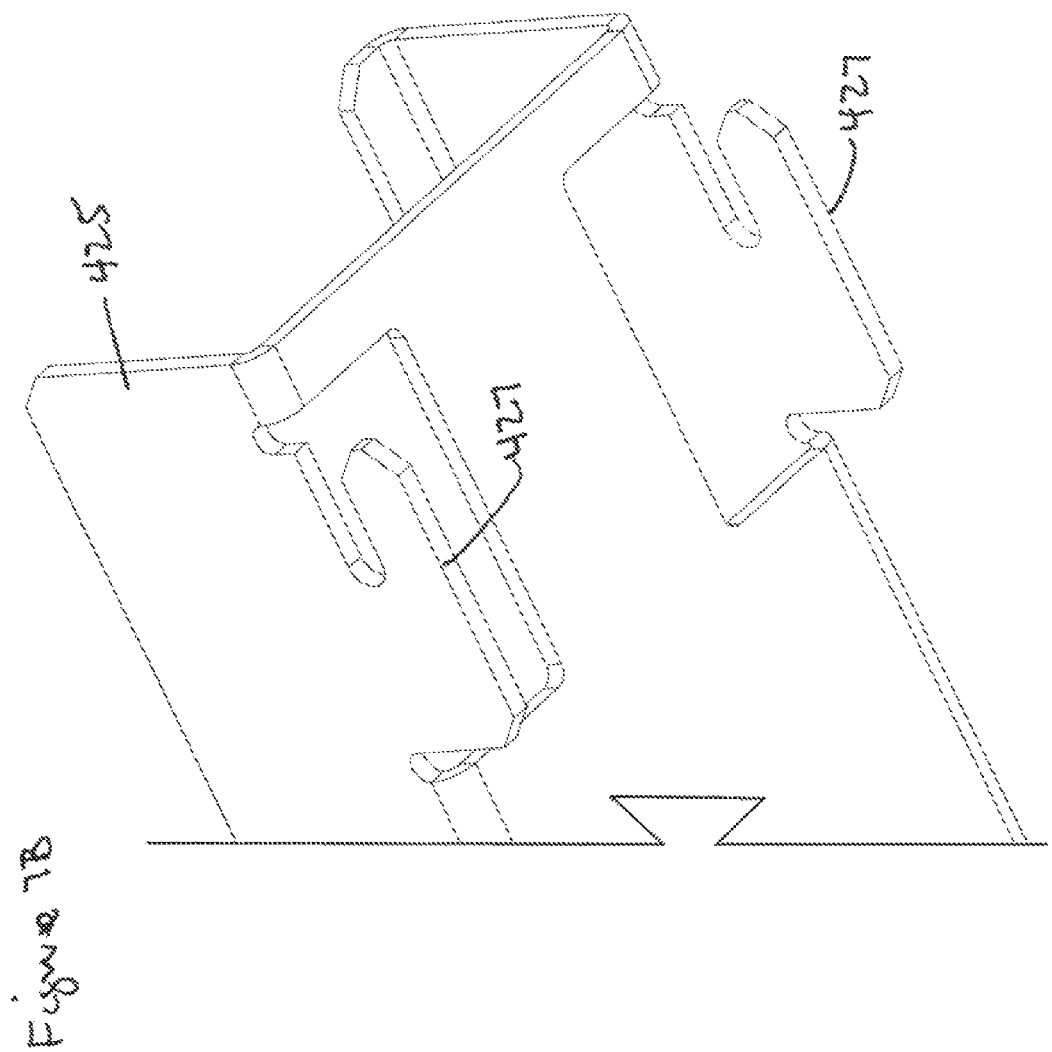
FIG. 7A is a perspective view of the outer rail in accordance with an embodiment of the present invention.
FIG. 7B is an enlarged sectional view taken along line 7B-7B from FIG. 7A.
FIG. 7C is an enlarged sectional view taken along line 7C-7C from FIG. 7A.

While the invention is susceptible to embodiments in many different forms, there are shown in the drawings and will be described in detail herein the preferred embodiments of the present invention. It should be understood, however, that the present disclosure is to be considered an exemplification of the principles of the invention and is not intended to limit the spirit or scope of the invention and/or claims of the embodiments illustrated.

Referring now to FIGS. 1A-2, there is shown a standard server frame 100 that has four corner posts 110 that are secured to a base structure 120 and a top structure 130 by bolts 105. As mentioned above, the corner posts 110 include standard EIA-310 openings 115 and spacing (shown in greater detail in FIG. 2). As illustrated, the corner posts 110 extend vertically and are designed to support servers 140 or other electronic components. The standard openings 115 are designed to receive and secure to a standard support rail system. However, because of the aforementioned disadvantages, the present invention further includes an improvement over the standard server frames.

Referring now also to FIG. 1B through FIG. 3B, the standard server frame 100 can now be improved by including an interior post 200 secured directly to each corner post 110 by fasteners 205. The fasteners 205 may be similarly defined as bolts 105. Each interior post 200 has a base plate 210 and an arm plate 220 extending substantially perpendicularly from the base plate 210 and extending inwardly such that the arm plate 220 is facing a diametrically opposed arm plate 220' on the opposite corner. Each interior post 200 may be secured directly to a corner post 110 (either to an end wall 110a or side wall 110b defined thereby) or to the base structure 120 and a top structure 130 (further discussed below). For further reference a pair of interior posts would be secured either to or adjacent the two back corner posts while a pair of interior posts would be secured against to or adjacent the two front corner post. As such the arm plates on the two interior posts about the back corner posts would face each other while the arm plates on the two interior posts about the front corner posts would face each other. When the interior posts are secured directly to the corner posts, a fastening opening 202 on the base plate 210 would align with an opening 112 on the corner post 110 for receipt of the fastener 205. Positioned along the arm plate 220 are rail apertures 225, which as described below are sized and positioned to receive hooks (427 or 432) extending from an improved outer rail 420. The interior posts 200 can be retrofitted to an existing rack or can be integrated by the rack manufacturer from the factory before shipment to the end user.

Referring now also to FIGS. 4A through 5. In another aspect of the invention, a support brace 300 can be utilized between a pair of front or back interior posts. The support brace 300 spans across a pair of front or back interior posts 200 and help to keep the two interior posts aligned. The support brace 300 includes brace ends 305, each brace end 305 have an end slot 310 to receive the arm plate 220 when the support brace 300 is attached. The end slot 310 in the brace end 305 creates a brace end member 315 on the distal side of the end slot 310. The brace body 320 is positioned on the other side of the end slot 310. Each side of the brace body 320 adjacent the end slot 310 has an extension pin 335, which when the brace is attached, extends into an EIA-310 opening 115 on the corner post 110. To secure the support brace 300 between the pair of interior posts, an end bracket 350 are secured at each brace end 305. The end bracket 350 is secured about each brace end with screws 352. In addition, each end bracket 350 includes a bracket head 355 that is sized to fit in a rail aperture 225 on the interior post 200.

Referring now also to FIGS. 6A through 8, as mentioned above the interior posts 200 allow for the quick attachment of outer rails 420, which are part of the sliding rail structure 400. The outer rails 400 can be engaged using the combination of a tool-less clip or may use hardware (screws/quick rivets/thumbscrews/etc.) dependent on user preference. In this embodiment, the outer rails are more universal, meaning they are common between a variety of equipment manufacturers and equipment models. As discussed previously, prior art tool-less rails employ end mechanism that reduce the amount of volume available to the server chassis by wrapping around the outside of the server frame ends, while the proposed embodiments utilize end mechanism contained on the inside of the server frame to maximize the usable volume.

By attaching the interior posts about the corner posts, which use the EIA-310 standard holes, it allows for unique attachment and locking techniques. For example, the shown embodiment of the outer rail 420 uses a single clip 450 at the front allowing quick installation and removal. Prior server racking methods would usually have a locking mechanism at the rear and the front increasing complexity and increasing time to deploy and reconfigure a rack. The sliding rail structure 400 includes a typically inner rail 410 that is secured and fastened to the equipment. The inner rail 410 slides in engagement with the outer rail 420. The inner rail 410 attaches to front/back pair of interior posts 200 and once attached on either side of the standard server frame 100, the equipment 140 can slide along the sliding rail structure 400. In addition, the interior posts 200 do not interfere with the standard openings to allow the user to utilize both the interior posts 200 and the corner posts to attached equipment (FIG. 6B). In FIG. 6B typical outer rails 218 can be used to clip and attached to the standard openings 115 on the corner post 110, while the improved outer rail 420 can be used to secure equipment to the interior posts 200.

The outer rail 420 extends from the front to the rear of the server frame 100. Positioned about the rear end 425 of the outer rail 420 are rear facing hooks 427 that are spaced to fit in the rail apertures 225 of the arm plate 220 that is positioned about the rear of the server frame. While the term hooks are used throughout, the hooks may be easily replaced with slotted tabs or regular tabs without changes the scope or intention of the structure. Positioned about the front end 430 of the outer rail 420 are also rear facing hooks 432. Similarly, when attached the rear facing hooks 432 positioned about the front end 430 are spaced to fit in the rail apertures 225 of the arm plate 220 that is positioned about the front of the server frame 100. To secure the outer rail 420 in position, the rear facing hooks 427 and 432 are inserted in rail apertures 225 in interior posts 200 that are positioned at the front and rear of the server frame 100. The outer rail 420 can then be slide rearwardly so the rear facing hooks secure against the rail apertures (this is shown in FIG. 8).

As further illustrated in FIG. 6C, numerous outer rails 420 are shown attached to the interior posts 200. By way of further background, the current standard rails (which consist of an outer rail attached to the corner posts and an inner rail attached to the equipment and which slides with respect to the outer rail when the rails are connected) are often customized based on the equipment or equipment manufacturer. As such, a server manufactured by Company A uses different standard rails than a server manufactured by Company B. Moreover, Equipment X made by Company A may also use different standard rails than Equipment Z made by the same company. The use of the term standard rails simply refers to the fact that the rails attached to the corner posts uses a standard measured distance between the corner posts and uses a standard set of EIA-310 standard holes. One major problem that exists today is that as companies build more powerful equipment the weight of the equipment has dramatically increased and the size of the equipment has widened to accommodate all of the robust internal components. To ensure the equipment is properly placed in the server frames, rail manufactures use various techniques to ensure the equipment fits and fully supported within the standard frames. Rails are often thicker or taller to accommodate the equipment. However, extreme size limitations in the standard server frame simply prevents certain increased attributes and will limit the size and functionality of the equipment. The present invention with an interior post that is set back from the standard corner posts EIA-310 holes, widens the distance such that the new outer rails 420 that attach to the interior posts (as opposed to the corner posts) can accommodate equipment larger than standard equipment that fits within the distances defined by the EUA-310 holes. In addition, the present invention creates a more versatile outer rail that is able to accommodate various inner rails 422. As such, when equipment is changed or moved, while the inner rail has to change, the outer rail once installed can remain fixed.

Continuing to refer to FIGS. 8 through 9D, to help secure the outer rail 420 about the front of the server frame 100, the outer rail 420 may include a clip 450 made of a spring steel that allows it to flex. The clip 450 is secured against the inside body 440 of the outer rail 420 the clip 450 at one end 475 by a rivet 477 and includes a pair of outwardly facing flanges 452 at the other end 479 that fit into grooves 434 that are adjacent the front end 430 rear facing hooks 432 on the outer rail 420. When attaching the front end 430 of the outer rail 420 to the server frame 100, the outwardly facing flanges 452 flex inwardly to allow the rear facing hooks 432 to slide into engagement with the rail apertures 225. Once positioned (FIG. 8) the outwardly facing flanges 452 return to their normal resting position against an edge 227 of the arm plate 220 of the interior post 200. To unlock and remove the outer rail 420 the outwardly facing flanges 452 are pressed inwardly until the user can slide the outer rail out of engagement with the interior post 200.

In another aspect of the present invention, FIGS. 10A-10D, the outer rail 420 includes a clip 450 that is locked in place by an outwardly facing screw 460 such that the outer rail 420 can only be unlocked from the inside of the server frame 100. Once in positioned as described above, the screw 460 is placed to secure the clip 450 and prevent the clip from flexing out of engagement with the interior post. The outwardly facing screw 460 is secured through a clip opening 458 and a corresponding opening in the outer rail 420.

Figure 11A:
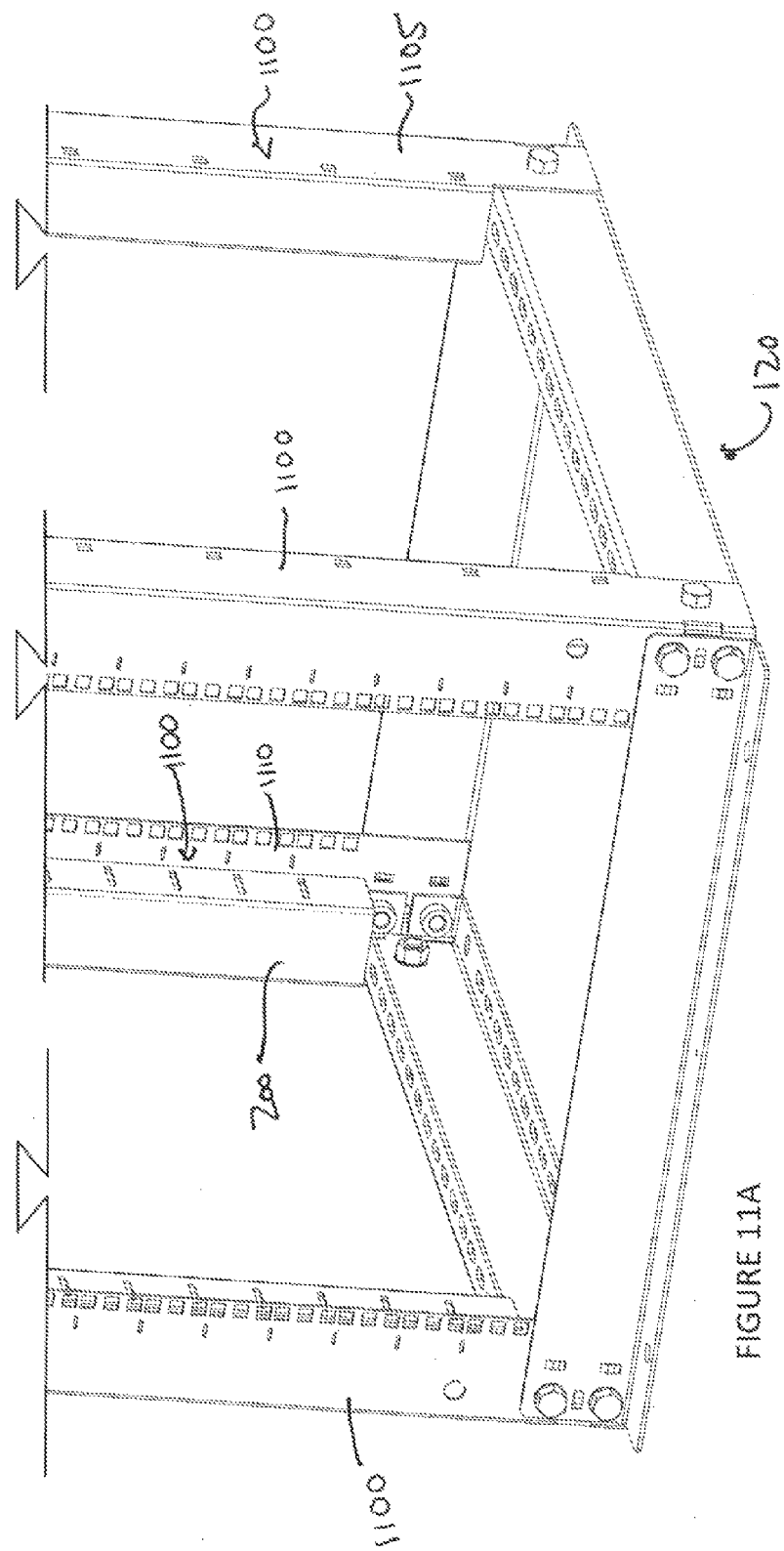
Figure 11C:
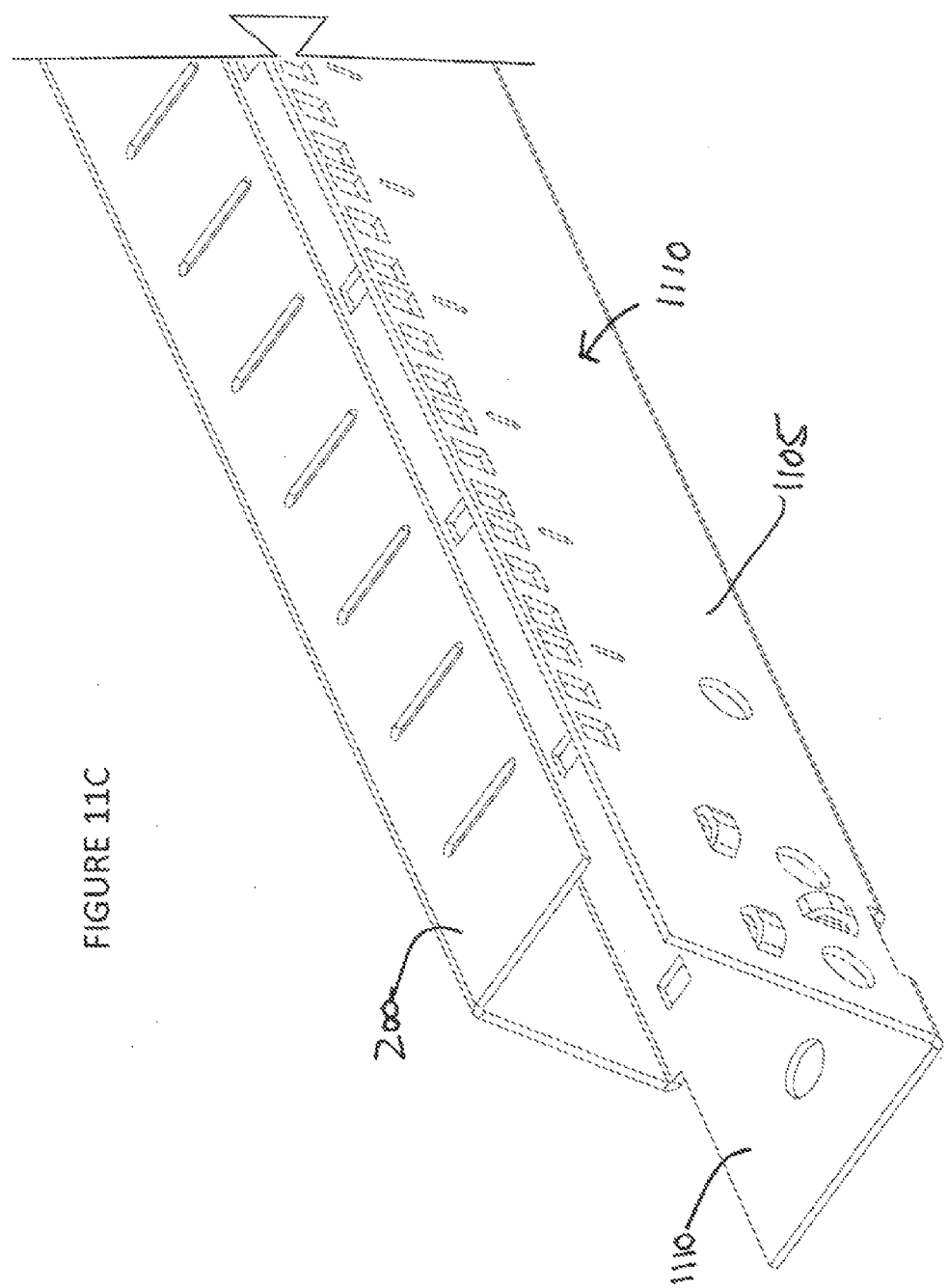
Figure 12B:
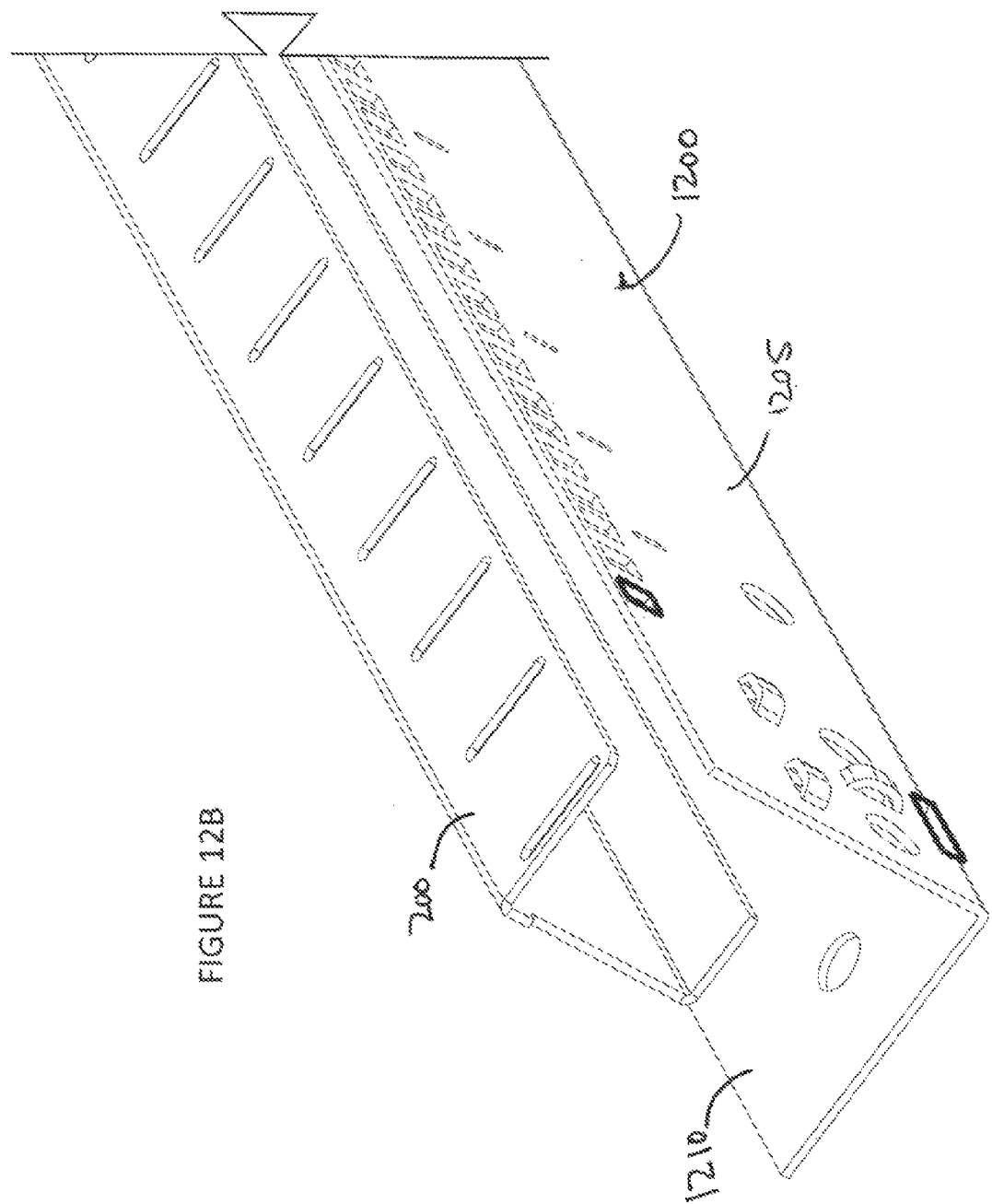
Figure 13A:
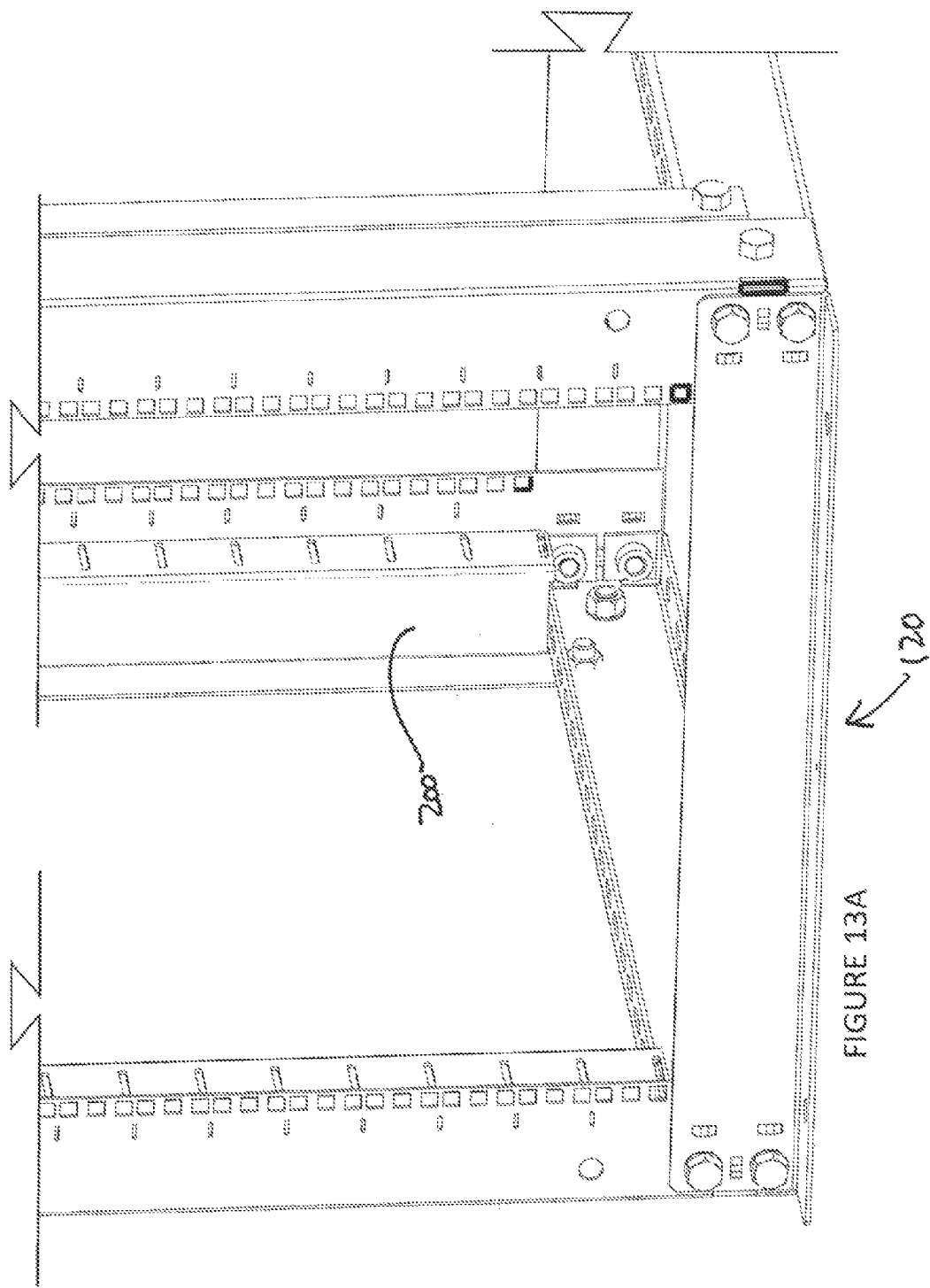
FIGS. 13A through 13B illustrate in an alternative embodiment the interior post is fastened directly to the top and bottom structure.
Figure 13B:
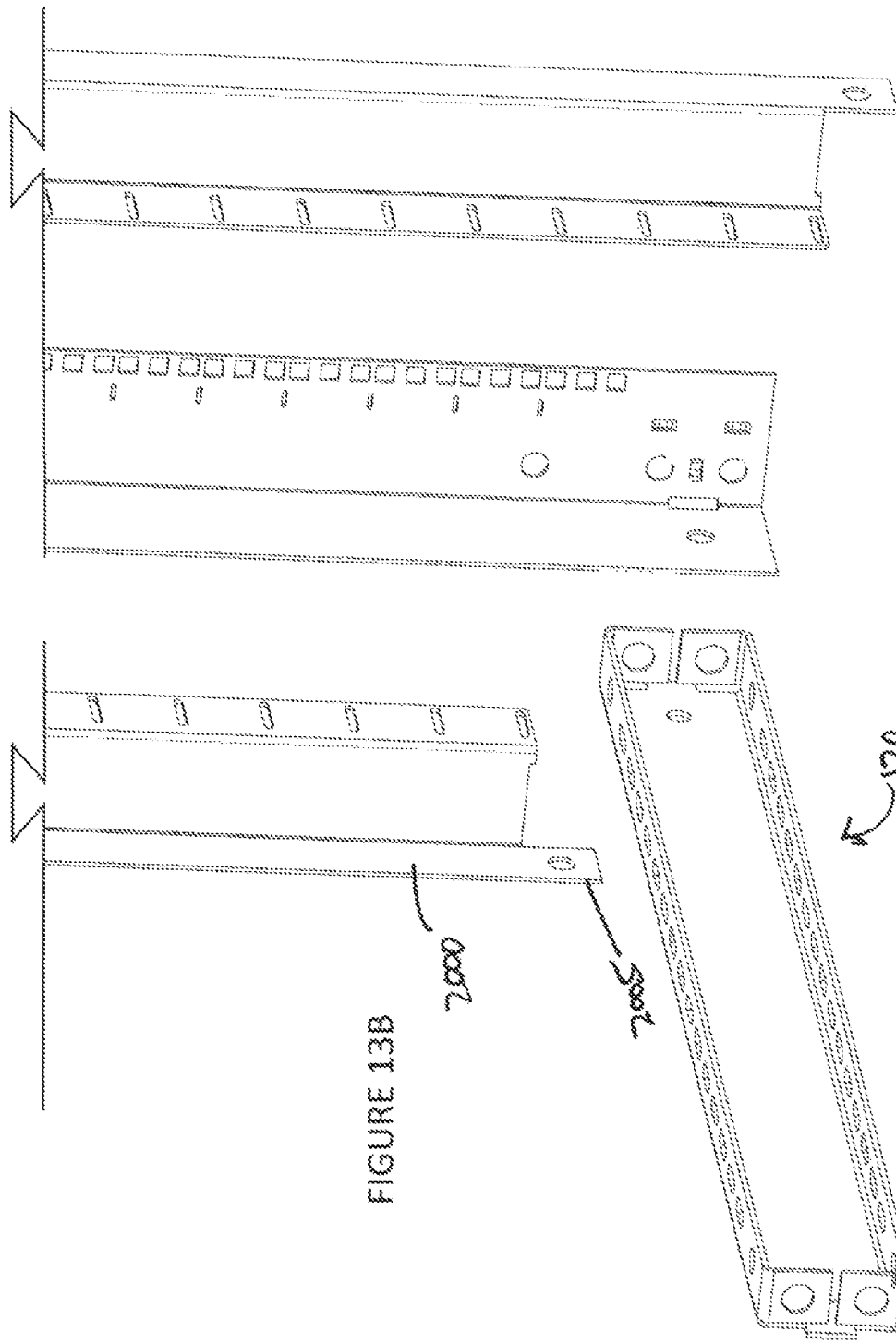

Referring now to FIGS. 11A-13B, as mentioned above, each interior post 200 may be secured directly to a corner post 110 (either to an end wall 110a or side wall 110b defined thereby) or to the base structure 120 and a top structure 130. FIGS. 11A-11C illustrate in an alternative embodiment the interior post 200 being part of the corner post 110, to create a new corner post 1100. As illustrated, the corner post 1100 includes an end wall 1105 and a side wall 1110. The corner post 1100 is attached to the top and bottom structures of the server frame. Extending from the side wall 1110 or the end wall is the interior post 200. As illustrated in FIG. 11C, the interior post 200 extends from an edge of the side wall 1110. FIGS. 12A-12C illustrate in an alternative embodiment the interior post 200 being secured to the side wall 1210 of the corner post 1200, via fasteners or by welding. Lastly in FIGS. 13A-13B, the interior post 200 is fastened directly to the top (not shown) and bottom structure 120. As shown in FIG. 13B the side wall 2000 of the interior post includes a flange 2005 with an opening to align with an opening on the bottom structure and to receive a fastener. The same (while not shown) would be provided by the top structure of the service frame.

As provided in one or more of the embodiments, the server rack system provides for a more complete rail system that allows servers to be attached to the internal frame such that the rails can be mounted further apart than if the rails are mounted in a standard EIA-310 19" rack. This extra width allows the invention to provide for more mounting solutions for a wider variety of server, network and storage chassis types. In addition, the system is also extremely changeable. The simplified rail and frame embodiments provided herein make it is easy to remove and replace rails to accommodate different size chassis.

As defined throughout the specification the terms clips and hooks may be as configured through the illustrations and descriptions and thus have in one or more embodiments particular meanings. For example clips can be a spring-like material used to help secure the ends of the outer rails to the interior posts. However, various hardware or fasteners may be used without deviating from the spirit and scope of the invention. Similarly, hooks may be a device that extends outwardly and towards the rear from one side of the rail and which are designed to slide within a defined rail aperture. However, the term hooks may encompass broader type fasteners and means of fastening one component to another. For example, the hooks 427 and 432 may cover a knob extending outwardly from the rail which slides into a keyhole aperture. As such the aperture and hooks for which are referred to in the claims can accommodate any type of fastening pair that one skilled in the art could easily replace to accomplish the same functionality.

As described herein the embodiments of the present invention utilize terms such as the front and rear. It being well understood that these terms or the orientation can be reversed such that the components or portions positioned at the rear could easily be switched to the front. Such a change in the orientation are well within the scope of the present invention.

From the foregoing and as mentioned above, it is observed that numerous variations and modifications may be effected without departing from the spirit and scope of the novel concept of the invention. It is to be understood that no limitation with respect to the embodiments illustrated herein is intended or should be inferred. It is intended to cover, by the appended claims, all such modifications within the scope of the appended claims.

We claim:

1. A server frame system for securing equipment thereto, the server frame system includes a server frame having four corner posts secured between a base structure and a top structure, each corner post has a side wall and an end wall thereby defining a pair of sides, a front of the server frame and a rear of the server frame, each corner post further has a plurality of standard EIA-310 openings to receive ends of a standard outer rail configured to secure and support the equipment to the server frame, the system comprising:

four interior posts, each interior post has a base plate and has an arm plate extending from the base plate inwardly such that the arm plate is facing a diametrically opposed arm plate on an opposite corner of the server frame, each interior post is attached about one of the four corner posts, and each arm plate includes rail apertures extending along a portion of the interior posts; and a pair of secondary outer rails, separately and removably attached from the front to the rear of each side of the server frame, each secondary outer rail has a rear end and a front end with rear facing hooks positioned on both the rear end and the front end of the secondary outer rail, and wherein the rear facing hooks being configured to slide into and engage the rail apertures on the interior posts, and wherein when the pair of secondary outer rails are attached to the interior posts, the secondary outer rails are configured to receive inner rails secured to equipment for sliding the equipment into and out of the server frame.

2. The server frame system of claim 1, wherein each interior post has the arm plate extending substantially perpendicularly from the base plate.

3. The server frame system of claim 1, wherein each interior post is secured to one of the corner posts by securing the base plate of the interior post to the side wall or end wall of the corner post without interfering with the standard EIA-310 openings, whereby a standard outer rail and the secondary outer rail are configured to attach to the corner posts and interior posts respectively.

4. The server frame system of claim 1, wherein each interior post is secured about the corner posts by securing the interior post to the base structure and top structure of the server frame without interfering with the standard EIA-310 openings, whereby a standard outer rail and the secondary outer rail are configured to attach to the corner posts and interior posts respectively.

5. The server frame system of claim 1, further comprising a support brace secured between a pair of interior posts.

6. The server frame system of claim 5, wherein the support brace includes brace ends, each brace end has an end slot to receive the arm plate when attached, and adjacent each end slot is an extension pin that is sized to extend into an EIA-310 opening on the corner post.

7. The server frame system of claim 6, wherein the support brace further includes an end bracket secured to each brace end, each end bracket further includes a bracket head sized to fit in a rail aperture on the interior post.

8. The server frame system of claim 1, wherein each secondary outer rail further includes a clip secured at an end against an inside portion of the secondary outer rail and secured adjacent the rear facing hooks on the front end of the secondary outer rail, the clip further having a pair of outwardly facing flanges configured to fit in grooves positioned adjacent the front end, and the clip being made from a material configured to flex such that the outwardly facing flanges move to allow the front end of the secondary outer rail to engage against the interior post.

9. The server frame system of claim 8, wherein the clip is secured to the inside position of the secondary outer rail by a fastener to prevent the outwardly facing flanges to flex and thereby preventing the front end of the secondary outer rail from disengaging from the interior post.

10. An improved server frame for securing equipment thereto, the server frame includes four corner posts secured between a base structure and a top structure, each corner post has a side wall and an end wall thereby defining a pair of sides, a front, and a rear of the server frame, each end wall further having a plurality of standard EIA-310 openings which define a standard EIA distance there between and for which ends of a standard outer rail are received and used to secure and support standard sized equipment to the server frame, the improvement comprising:

four interior posts, configured as a pair of front interior posts and a pair of rear interior posts, each interior post includes rail apertures extending along a portion thereof, and each interior post is separately secured to one of the corner posts at a position that un-obstructs the standard EIA-310 openings and said position is further configured to create a rail aperture distance between the pair of front interior posts and between the pair of rear interior posts that is greater than the standard EIA distance; and a secondary outer rail configured to attach to the interior posts and is further configured to accommodate equipment larger than the standard sized equipment.

11. The improved server frame of claim 10, wherein each interior post has a base plate and has an arm plate extending from the base plate inwardly such that the pair of front interior posts face each other and the pair of rear interior posts face each other, each arm plate includes the rail apertures extending along at least a portion of the arm plate.

12. The improved server frame of claim 11, wherein each interior post is secured to one of the corner posts by securing the base plate of the interior post to the end wall of the corner post without interfering with the standard EIA-310 openings, such that both a standard support rail system and a second pair of outer rails can separately attach to the corner posts and the interior posts respectively.

13. The improved server frame of claim 11, wherein each interior post is secured to one of the corner posts by securing the base plate of the interior post to the side wall of the corner post without interfering with the standard EIA-310 openings, whereby a standard outer rail and the secondary outer rail are configured to attach to the corner posts and interior posts respectively.

14. The improved server frame of claim 11, wherein each interior post is secured about the corner posts by securing the interior post to the base structure and top structure of the server frame without interfering with the standard EIA-310 openings, whereby a standard outer rail and the secondary outer rail are configured to attach to the corner posts and interior posts respectively.

15. The improved server frame of claim 11, wherein each secondary outer rail separately secures from the front to the rear of each side of the interior posts, each secondary outer rail has an elongated body with opposing rear and front ends, each rear and front ends include rear facing hooks extending directly therefrom, the rear facing hooks being configured to slide into engagement with the rail apertures on the interior posts, and wherein when the pair of secondary outer rails are secured to the interior posts, the secondary outer rails are configured to receive inner rails secured to equipment for sliding the equipment into the server frame.

16. The improved server frame of claim 15, further comprising:
a clip secured at an end against an inside portion of the body of the secondary outer rail and secured adjacent the rear facing hooks on the front end of the secondary outer rail, the clip further having a pair of outwardly facing flanges configured to fit in grooves positioned adjacent the front end, and the clip being made from a material configured to flex such that the outwardly facing flanges move to allow the front end of the secondary outer rail to engage against the interior post.

17. An outer rail for use in a server frame system for securing equipment thereto, the server frame system having a plurality of rail apertures, the outer rail comprising:
an elongated body extending from a front end to a rear end, each end having rear facing hooks extending outwardly from the elongated body and configured to slide into and out of engagement with the rail apertures, the elongated body further having a pair of grooved notches extending along the front end and adjacent the rear facing hooks; and
a clip having a first end secured against an inside portion of the elongated body and secured adjacent the front end rear facing hooks, the clip having a pair of outwardly facing flanges extending at a second end diametrically opposed to the first end, and the flanges configured to fit in through the grooved notches, and wherein the clip is further made from a material configured to flex such that the outwardly facing flanges move within the grooved notches to a substantially flush configuration against the elongated body, and wherein
the outer rail is removably attached to the server frame system by engaging the rear facing hooks in the rail apertures and the outwardly facing flanges against a portion of the server frame system adjacent the rail apertures.

18. The outer rail of claim 17, wherein the clip is secured to the inside position of the outer rail by a fastener to prevent the outwardly facing flanges to flex and thereby preventing the front end of the outer rail to disengage from the server frame.

19. An improved server frame for securing equipment thereto, the server frame includes four corner posts secured between a base structure and a top structure, each corner post has a side wall and an end wall thereby defining a pair of sides, a front, and a rear of the server frame, each end wall further having a plurality of standard EIA-310 openings to receive ends of a standard outer rail used to secure and support the equipment to the server frame, the improvement comprising:
four interior posts, configured as a pair of front interior posts and a pair of rear interior posts, each interior post has a base plate and has an arm plate extending from the base plate inwardly such that the pair of front interior posts face each other and the pair of rear interior posts face each other, each interior post is separately secured to one of the corner posts, and wherein each arm plate includes rail apertures extending along at least a portion of the arm plate, such that secondary outer rails secure to the interior posts and wherein each interior post is secured to one of the corner posts such that the interior post does not interfere with the standard EIA-310 openings, whereby a standard outer rail and the secondary outer rails are configured to attach to the corner posts and interior posts respectively.

20. The improved server frame of claim 19, wherein each interior post is secured to one of the corner posts by securing the base plate of the interior post to the end wall of the corner post without interfering with the standard EIA-310 openings, such that both a standard support rail system and a second pair of outer rails can separately attach to the corner posts and the interior posts respectively.

21. The improved server frame of claim 19, wherein each interior post is secured to one of the corner posts by securing the base plate of the interior post to the side wall of the corner post without interfering with the standard EIA-310 openings, whereby a standard outer rail and the secondary outer rail are configured to attach to the corner posts and interior posts respectively.

22. The improved server frame of claim 19, wherein each interior post is secured about the corner posts by securing the interior post to the base structure and top structure of the server frame without interfering with the standard EIA-310 openings, whereby a standard outer rail and the secondary outer rail are configured to attach to the corner posts and interior posts respectively.

23. The improved server frame of claim 19, wherein each secondary outer rail separately secures from the front to the rear of each side of the interior posts, each secondary outer rail has an elongated body with opposing rear and front ends, each rear and front ends include rear facing hooks extending directly therefrom, the rear facing hooks being configured to slide into engagement with the rail apertures on the interior posts, and wherein when the pair of secondary outer rails are secured to the interior posts, the secondary outer rails are configured to receive inner rails secured to equipment for sliding the equipment into the server frame.

24. The improved server frame of claim 23, further comprising:
a clip secured at an end against an inside portion of the body of the secondary outer rail and secured adjacent the rear facing hooks on the front end of the secondary outer rail, the clip further having a pair of outwardly facing flanges configured to fit in grooves positioned adjacent the front end, and the clip being made from a material configured to flex such that the outwardly facing flanges move to allow the front end of the secondary outer rail to engage against the interior post.

25. The improvement of claim 24, wherein each clip is further configured to allow the inner rails to slide against the outer rails and over each clip without being encumbered by the clip.

* * * * *